(12) United States Patent
Kawase et al.

(10) Patent No.: US 7,458,147 B2
(45) Date of Patent: Dec. 2, 2008

(54) METHOD FOR DETERMINING WHETHER A COMPONENT HOLDER IS DEFECTIVE

(75) Inventors: Takeyuki Kawase, Tosu (JP); Toshiyuki Kino, Tosu (JP); Takanori Yoshitake, Tosu (JP); Kimiaki Sano, Tosu (JP); Yoshiyuki Hattori, Kofu (JP); Takashi Yazawa, Kai (JP); Hiroshi Uchiyama, Takarazuka (JP); Youichi Tanaka, Ogoori (JP); Shigeki Imafuku, Minami-arupusu (JP); Iwao Kanetaka, Tosu (JP); Tamaki Ogura, Saga (JP)

(73) Assignee: Panasonic Corporation, Osaka (JP)

( * ) Notice: Subject to any disclaimer, the term of this patent is extended or adjusted under 35 U.S.C. 154(b) by 344 days.

(21) Appl. No.: 10/522,978

(22) PCT Filed: Aug. 7, 2003

(86) PCT No.: PCT/JP03/10044

§ 371 (c)(1),
(2), (4) Date: Feb. 2, 2005

(87) PCT Pub. No.: WO2004/016064

PCT Pub. Date: Feb. 19, 2004

(65) Prior Publication Data

US 2005/0258381 A1   Nov. 24, 2005

(30) Foreign Application Priority Data

Aug. 8, 2002  (JP) .............................. 2002-231811
Nov. 12, 2002 (JP) .............................. 2002-328050

(51) Int. Cl.
*H05K 3/30* (2006.01)

(52) U.S. Cl. .......................................... 29/833; 29/832
(58) Field of Classification Search ................... 29/832, 29/833
See application file for complete search history.

(56) References Cited

U.S. PATENT DOCUMENTS

| 4,745,295 A | 5/1988 | Seno et al. |
| 5,764,874 A | 6/1998 | White |
| 5,878,484 A * | 3/1999 | Araya et al. .................. 29/740 |

(Continued)

FOREIGN PATENT DOCUMENTS

JP    9-275300    10/1997

(Continued)

*Primary Examiner*—Carl J. Arbes
(74) *Attorney, Agent, or Firm*—Wenderoth, Lind & Ponack, L.L.P.

(57) ABSTRACT

The present invention provides a device and a method for determining whether or not a component holder is good, which enable detecting component holders that are to affect correct component recognition and further enable preventing interferences between constituent devices, a component mounting apparatus with the determining device, and a component mounting method. The determining device has an illuminating device, a CCD camera and a controller to determine whether or not a suction nozzle is good based on luminance at a component hold face of the suction nozzle. The suction nozzle having light reflectance of the component hold face increased to a level whereat a correct recognition of an electronic component held by the suction nozzle is affected, can be detected accordingly. An interference preventing device is also provided, so that interference between the CCD camera and the suction nozzle can be prevented.

10 Claims, 18 Drawing Sheets

U.S. PATENT DOCUMENTS

| | | | |
|---|---|---|---|
| 6,286,202 B1 * | 9/2001 | Asai et al. | 29/740 |
| 6,385,507 B1 | 5/2002 | Buijtels | |
| 6,507,997 B2 * | 1/2003 | Kawai et al. | 29/833 |
| 6,643,921 B2 * | 11/2003 | Asai et al. | 29/833 |
| 6,662,438 B2 * | 12/2003 | Suhara et al. | 29/743 |
| 6,807,726 B2 * | 10/2004 | Iisaka et al. | 29/740 |
| 2001/0047586 A1 * | 12/2001 | Kawai et al. | 29/833 |

FOREIGN PATENT DOCUMENTS

| | | |
|---|---|---|
| JP | 10-117099 | 5/1998 |
| JP | 10-163690 | 6/1998 |
| JP | 2002-190697 | 7/2002 |

* cited by examiner

Fig.8
| NOZZLE | OBJECT COMPONENT | NOZZLE GLITTER TO BE CHECKED |
|---|---|---|
| SX NOZZLE | 0.6mm×0.5C,R | ○ |
| SA NOZZLE | 1.0mm×0.5C,R<br>SS MINI TRANSISTOR | ○ |
| S NOZZLE | 1.6mm×0.8<br>2.0mm×1.25C,R<br>S MINI TRANSISTOR (2mm×2.1) | ○ |
| M NOZZLE | TANTALUM CAPACITOR (6mm×3.5)<br>TRIMMING POTENTIOMETER (4.5mm×3.8)<br>ALUMINA ELECTROLYTIC CAPACITOR (4.3mm×4.3) | ○ |
| L NOZZLE | SOP (DIMENSIONS NOT SMALLER THAN 7.6mm)<br>QFP (DIMENSIONS NOT SMALLER THAN 12mm) | × |
Fig.9
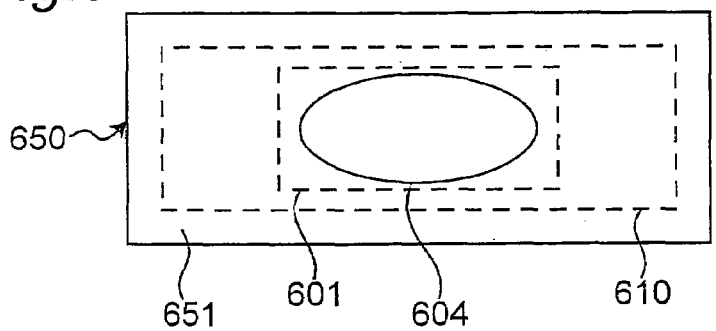
Fig.10
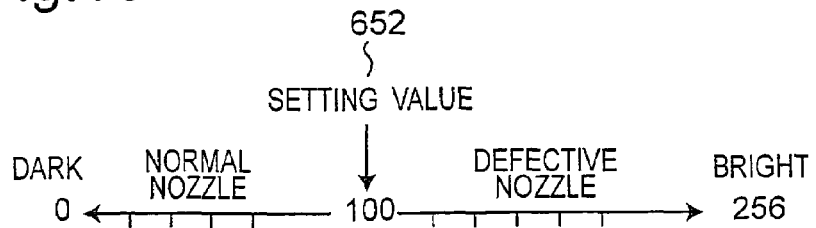

METHOD FOR DETERMINING WHETHER A COMPONENT HOLDER IS DEFECTIVE

TECHNICAL FIELD

The present invention relates to a device and a method for detecting whether or not a component holder for holding, for instance, an electronic component or the like, is good, and an apparatus and a method for mounting components with the detecting device.

BACKGROUND ART

Conventionally, as shown in FIG. 25, in a component mounting apparatus 10 for mounting electronic components 2 onto a circuit board 3, after electronic component 2 is sucked to a suction face at a leading end of a suction nozzle 1, the electronic component 2 held by the suction nozzle 1 passes over an illuminating device 4 during a time while the electronic component is moved to the circuit board 3. The illuminating device 4 illuminates a lower face of the electronic component 2 from below the electronic component 2 held by the suction nozzle 1, and a recognizer 5 performs an image-pickup operation of the electronic component 2 by reflecting light from the lower face. On basis of this image-pickup information, a positional deviation of the electronic component 2 sucked by the suction nozzle 1 is detected. The electronic component 2 having the positional deviation detected is corrected in this position and then mounted onto a predetermined position of the circuit board 3.

In detecting the positional deviation of the electronic component 2, particularly in a case where a suction face at the suction nozzle 1 has an area larger than an area of the electronic component 2 recognized by the recognizer 5, it is difficult to distinguish from each other reflecting light from the suction nozzle 1 including the suction face and reflecting light from the electronic component 2. Correct judgment of the positional deviation of the electronic component 2 is hindered in some cases. For avoiding effects of the reflecting light from the suction nozzle 1 in the recognizer 5, the suction nozzle 1 is made from a material of low reflectance, is coated for lowering reflectance, or is adapted in a like way.

However, through repetition of suction of electronic components 2, the suction face of the suction nozzle 1 formed of low reflectance material or subjected to coating receives adhesion of metals of the electronic components 2, or the coating of the suction face peels off, whereby reflectance is increased. In consequence, if the electronic component 2 is small relatively to the suction face of the suction nozzle 1 as referred to above, the recognizer 5 detects reflecting light from the suction face of the suction nozzle 1 unfavorably, which leads to a problem in that a position of the electronic component 2 cannot be recognized correctly or the suction nozzle 1 is mistakenly recognized as holding the electronic component 2 although the suction nozzle 1 does not suck the electronic component 2.

SUMMARY OF THE INVENTION

The present invention is developed to solve the above-described problems, and has for its object to provide a device and a method for detecting whether or not a component holder is good, and an apparatus and a method for mounting components with the detecting device, which enable detecting a component holder that affects correct recognition of components and moreover enable preventing interference between constituent devices.

In accomplishing the object, the present invention can be constituted as follows.

Namely, according to a first aspect of the present invention, there is provided a device for detecting whether or not a component holder is good, which comprises:

an illuminating device for emitting light to a component holder having a component hold face with an area not smaller than a light reflection face of a component;

an image-pickup device for performing an image-pickup of the component hold face illuminated by illumination of the illuminating device; and a controller for determining whether or not the component holder is good on basis of luminance of the component hold face in image-pickup information of the component hold face supplied from the image-pickup device.

The above detecting device of the first aspect may be designed so that the controller has a setting value set on basis of total luminance by reflection from the component and the component hold face when the illuminating device emits light in a state with the component being held at the component hold face, so that determined is that the component holder is defective when luminance at the component hold face in a state without the component being held is not smaller than the setting value.

The above detecting device of the first aspect may be designed so that the controller has regional information related to a plurality of sections obtained by dividing the component hold face, and determines whether or not a luminance at each section is not smaller than the setting value.

The above detecting device of the first aspect may be designed so that when the luminance is smaller than the setting value, the controller determines the component holder as defective if an image corresponding to the component is recognized within imaging information of the component hold face supplied from the image-pickup device.

The above detecting device of the first aspect may be designed so that the controller has information related to an image of the component recognized within the imaging information of the component hold face, with the information related to the image being made image information of a size not larger than a minimum component to be held by the component holder.

The above detecting device of the first aspect may be designed so that the illuminating device emits light to the component holder by an amount of light for inspection which exceeds a maximum amount of light at a time when the illuminating device emits light to the component and the component hold face in a state with the component being held at the component hold face.

According to a second aspect of the present invention, there is provided a method for detecting whether or not a component holder is good, which comprises:

emitting light to a component holder having a component hold face of an area not smaller than a light reflection face of a component;

performing image-pickup of an illuminated component hold face; and determining whether or not the component holder is good on basis of luminance of the component hold face in image-pickup information of the component hold face.

According to a third aspect of the present invention, there is provided a component mounting apparatus which comprises:

a device for detecting whether or not a component holder is good which includes: an illuminating device for emitting light to the component holder having a component hold face of an area not smaller than a light reflection face of a component; an image-pickup device for performing image-pickup of the component hold face illuminated by the illuminating device; and a controller for determining whether or not the component holder is good on basis of luminance of the component hold face in imaging information of the component hold face supplied from the image-pickup device;

a component supply device for supplying a component to be held by the component holder; and a component load and transfer device with the component holder for holding the component from the component supply device with the component holder and mounting this held component onto a circuit board.

The above component mounting apparatus of the third aspect may be designed so that the component load and transfer device has a detecting device supporter with a plurality of component holders arranged in an array for holding the illuminating device and the image-pickup device disposed opposite to component hold faces of the component holders and included in the detecting device, and a drive unit for moving the detecting device supporter in relation to the component holders along an arrangement direction of the component holders.

The above component mounting apparatus of the third aspect may be designed so that the apparatus further comprises a cleaning device for cleaning a component hold face of a defective component holder determined as defective by the detecting device.

The above component mounting apparatus of the third aspect may be designed so that the apparatus further comprises a holder replacement device for separating and holding a defective holder determined as defective by the detecting device from the component load and transfer device, and holding a spare component holder for the component holder installed in the component load and transfer device.

The above component mounting apparatus of the third aspect may be designed so that the component load and transfer device further has driving parts for ascent and descent installed corresponding to respective component holders for moving the component holders up and down, and a position detector for detecting a position of the image-pickup device moved by the drive unit along the arrangement direction of the component holders, with the component mounting apparatus further having a trigger signal generator for generating a trigger signal for moving down the component holders to the driving parts for ascent and descent, so that the controller controls the driving parts for ascent and descent on basis of a position of the image-pickup device as detected by the position detector when the trigger signal is generated by the trigger signal generator.

According to a fourth aspect of the present invention, there is provided a component mounting method, in which whether or not a component holder is good is determined by performing a detecting method of determining whether or not the component holder is good on basis of luminance of a component hold face in imaging information of the component hold face by emitting light to the component holder having the component hold face of an area not smaller than a light reflection face of a component, and performing image-pickup of the illuminated component hold face after a component mounting operation, of holding a component by the component holder and mounting the component onto a circuit board, is performed a set number of times before a next component mounting operation is started.

The above component mounting method of the fourth aspect may be designed so that during a component mounting operation when components are sucked to the component holders by independently moving up and down a plurality of the component holders arranged linearly to each other, performed is image-pickup of the components sucked by the component holders by an image-pickup device by moving the image-pickup device from below the component holders along an arrangement direction of the component holders, which components are mounted to the circuit board after the image-pickup, wherein a position of the image-pickup device while moving is detected, so that downward movement of the component holders is controlled on basis of this detected position.

According to the device of the first aspect of the present invention for detecting whether or not a component holder is good, and the method of the second aspect for detecting whether or not a component holder is good, there are provided the illuminating device, the image-pickup device and the controller, thereby determining whether or not the component holder is good on basis of luminance at the component hold face of the component holder. Hence it is made possible to detect a component holder having reflectance of the component hold face increased to a level whereat correct recognition of the component held by the component holder is affected.

Whether or not the component holder is good can be determined with a higher accuracy by dividing the component hold face into sections and measuring luminance for each section.

In addition to measuring the luminance, image-pickup information of the component hold face is taken into account, so that accuracy of determining whether or not the component holder is good is improved further.

When it is determined with use of an amount of light for inspection whether or not the component holder is good, the amount of light for inspection exceeds an amount of light in a normal component recognition operation, so that a determination can be made with higher accuracy.

In the component mounting apparatus of the third aspect and the component mounting method of the fourth aspect of the present invention, there is provided the detecting device of the first aspect and the detecting method is performed, whereby contamination of the component hold face of the component holder, peeling off of a coating, and the like can be detected before the component is held. Accordingly, wrong recognition of the component, as a result of reflection at the component hold face during a component recognition operation performed before the component is mounted, can be reduced.

The component load and transfer device is provided with the detecting device supporter and the drive unit. A need of moving the component load and transfer device to a position where the recognizer is disposed as in the conventional art is eliminated at a recognition time of components held by the component holders. A mounting cycle time is thus shortened and availability in mounting components is increased consequently.

There is also provided a cleaning device. The component hold face of the component holder can be automatically cleaned when the component holder is determined as defective as a result of a detection as to whether or not the component holder is good.

When the holder replacement device is provided, the component holder can be automatically replaced with a normal suction nozzle if the component holder is not returned to the normal component holder in spite of cleaning by the cleaning device.

Moreover, the trigger signal generator is installed, and the component load and transfer device is provided with the position detector. While the image-pickup device moves along the arrangement direction of component holders, downward movement of a component holder can be stopped when the image-pickup device is located below a descending component holder, thus enabling preventing interference between the component holder and the image-pickup device.

In addition, in the component mounting method of the fourth aspect, a position of the moving image-pickup device is detected, and downward movement of the component holder is controlled on basis of this detected position. Therefore, the downward movement of the component holder can be stopped if the image-pickup device is below the descending component holder. Interference between the component holder and the image-pickup device can be prevented accordingly.

BRIEF DESCRIPTION OF DRAWINGS

These and other aspects and features of the present invention will become clear from the following description taken in conjunction with preferred embodiments thereof with reference to the accompanying drawings, in which:

FIG. 8 is a diagram showing correspondence between suction nozzles and electronic components in the electronic component mounting apparatus with the detecting device according to the first embodiment of the present invention;

FIG. 9 is a diagram showing an image-pickup state in measuring luminance at a component hold face in a normal state without any adhesion of metals, or the like contamination, to the component hold face of the suction nozzle;

FIG. 10 is a diagram showing a relationship between a threshold and a defective nozzle;

DETAILED DESCRIPTION OF THE PREFERRED EMBODIMENTS

Figure 1:
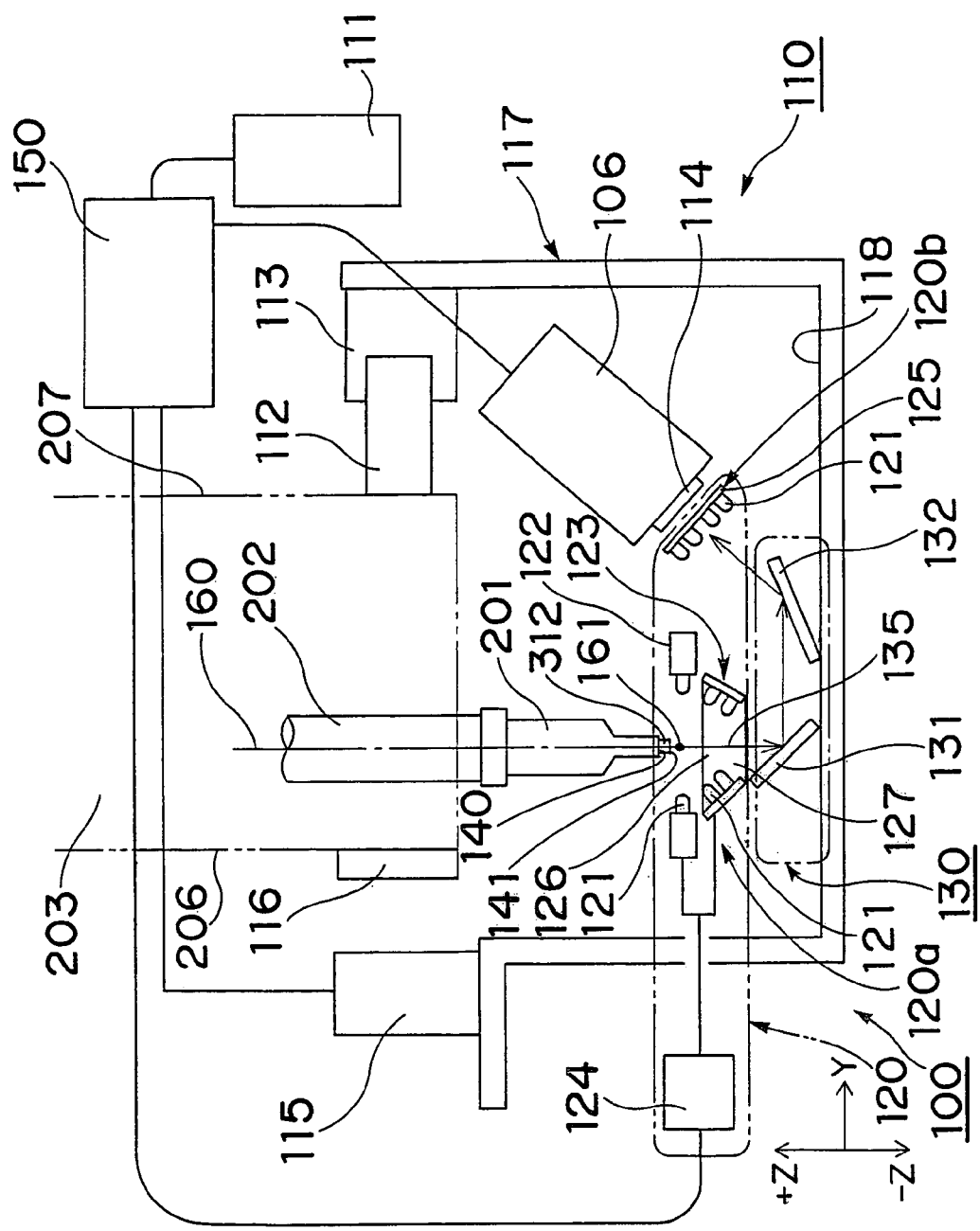
FIG. 1 is a side view showing a configuration of a device for detecting whether or not a suction nozzle is good according to a first embodiment of the present invention.

A device and a method for detecting whether or not a component holder is good, and an apparatus and a method for mounting components according to preferred embodiments of the present invention will be described in detail with reference to the attached drawings. The method for detecting whether or not the component holder is good is a detection method performed by the device for detecting whether or not the component holder is good, the component mounting apparatus is a mounting apparatus with the detecting device, and the component mounting method is a mounting method performed by the component mounting apparatus. Like parts are designated by like reference numerals throughout the drawings.

Figure 5:
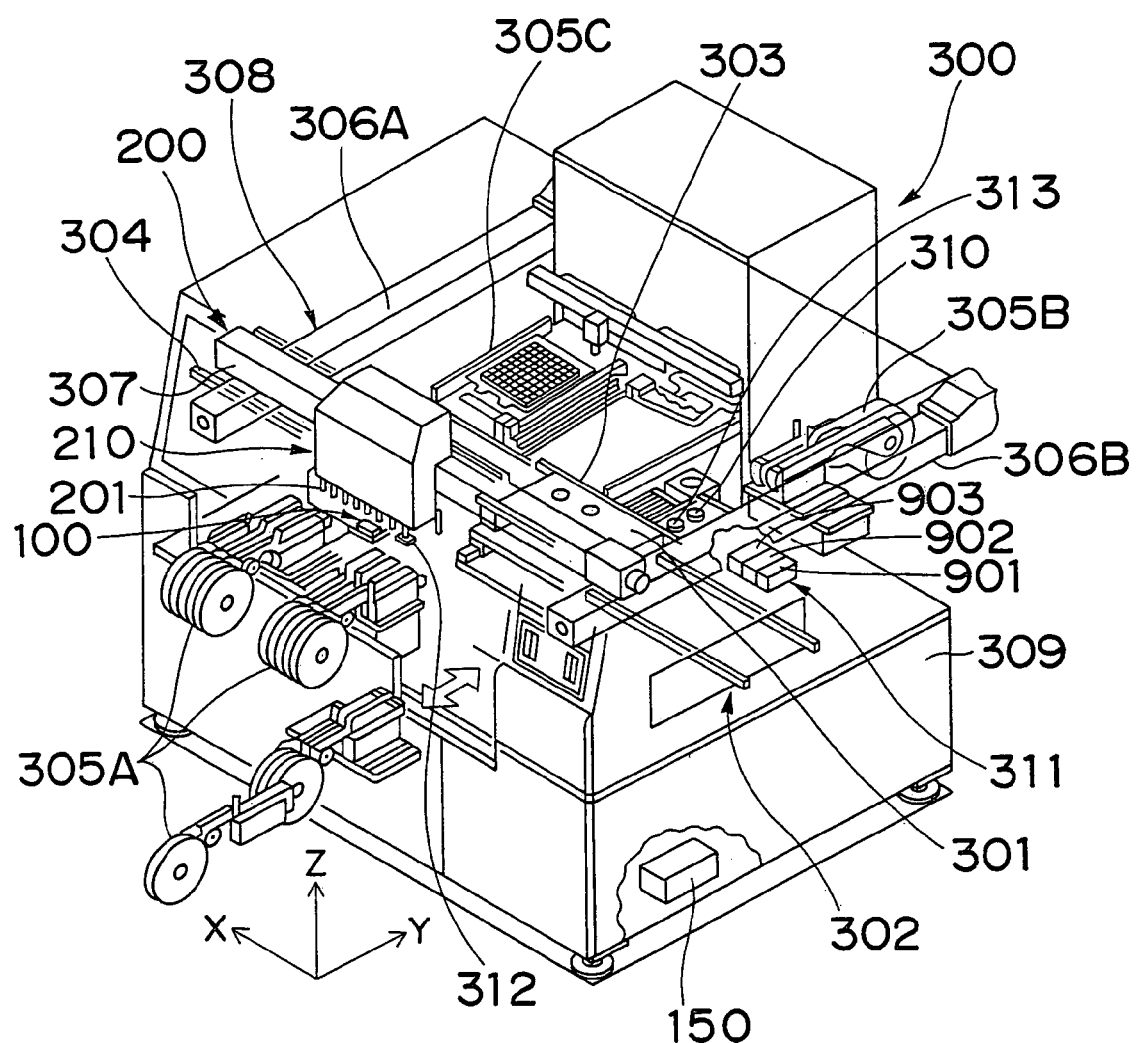
FIG. 5 is a perspective view showing a configuration of an electronic component mounting apparatus having the detecting device in the first embodiment of the present invention.

The component mounting apparatus with the detecting device will be described first. As shown in FIG. 5, a component mounting apparatus 300 fundamentally comprises a detecting device 100 to be detailed later for detecting whether or not a component holder is good, a component supply device 305, a component load and transfer device 200, and a controller 150. According to this embodiment, there are also arranged on a base 309, a loader part 302, a circuit board hold part 303, an unloader part 304, a suction nozzle changer 310 corresponding to an example functioning as a holder replacement device, and a cleaning device 311. In the component mounting apparatus 300, the component supply device 305 has a first component supply part 305A, a second component supply part 305B and a third component supply part 305C, while the component load and transfer device 200 has a transfer head part 210 and an XY-robot 308.

The loader part 302 is a device for carrying an electronic circuit board 301 supplied from an upstream side, which is a side of a pre process of the component mounting apparatus 300, into the circuit board hold part 303. The circuit board hold part 303 is a device for holding the electronic circuit board 301 carried in from the loader part 302 and making the circuit board 301 movable in X and Y-directions to position the circuit board to a predetermined position during a component mounting operation. The unloader part 304 is a device for transferring, after mounting of components, the electronic circuit board 301 carried out from the circuit board hold part 303 towards a downstream side, which is a side of a post process of the component mounting apparatus 300. The loader part 302, the circuit board hold part 303 and the unloader part 304 are arranged at a nearly central part of the base 309 in this order from the upstream side to the downstream side along an X-axis direction.

The first component supply part 305A and the second component supply part 305B are devices for supplying electronic components 312 for component mounting, which are so-called parts cassette type component supply devices for supplying components by transferring a tape respectively in which the electronic components 312 are stored. The third component supply part 305C is a so-called tray type component supply device for supplying electronic components 312 arranged in a grid pattern on a tray. The first component supply part 305A and the third component supply part 305C are disposed opposite each other along the Y-direction via the circuit board hold part 303, and the second component supply part 305B is arranged at an upstream side in a board transfer direction with respect to the third component supply part 305C.

The suction nozzle changer 310 is always equipped with at least one spare nozzle 313, which is a member as an example exerting a function of a component holder and which corresponds to a spare component holder of the same kind as or a different kind from a suction nozzle 201 of the transfer head part 210. Also, the suction nozzle changer 310 is a device for supplying a desired suction nozzle 201 to the transfer head part 210. The suction nozzle changer 310 is arranged between the third component supply part 305C and the second component supply part 305B in the present embodiment.

The cleaning device 311 has a solvent bath part 901, a solvent wiping part 902 and a finishing part 903. The solvent bath part 901 having a solvent 910 injected therein is a bath for cleaning the suction nozzle 201 by the solvent 910. For the solvent 910, for example, ethanol or isopropyl alcohol can be used. The solvent wiping part 902 is a device for wiping the solvent 910 adhering to the suction nozzle 201 after the suction nozzle 201 is cleaned at the solvent bath part 901, which has a cloth-shaped liquid absorber 911 set on an XY-plane. For example, a water-absorbing waste or the like is utilizable as the cloth-shaped liquid absorber 911. The finishing part 903 is a device for wiping stain or the like adhering to the suction nozzle 201, having a cloth-shaped contamination wiper 912 set on an XY-plane. For the cloth-shaped contamination wiper 912, for instance, chamois leather or the like is usable. The cleaning device 311 having the solvent bath part 901, the solvent wiping part 902 and the finishing part 903 is arranged at an upstream side of the suction nozzle changer 310 in the transfer direction of the circuit board 301. The solvent bath part 901, the solvent wiping part 902 and the finishing part 903 are arranged in this order along the X-axis direction from the upstream side to the downstream side.

The transfer head part 210 is a device for sucking electronic components 312 from the first component supply part 305A, the second component supply part 305B and the third component supply part 305C by suction nozzles 201. The XY-robot 308 has an X-axis robot 307, and a first Y-axis robot 306A and a second Y-axis robot 306B which are arranged at both ends of the X-axis robot 307 and have ball screw mechanisms rotating synchronously with each other so that the X-axis robot 307 is driven in the Y-axis direction. The transfer head part 210 is loaded on the X-axis robot 307. The transfer head part 210 having suction nozzles 201 for sucking electronic components 312 is thus made movable above the base 309 in the X and Y-directions.

In the present embodiment, the detecting device 100 is installed at the transfer head 210, which will be depicted in detail below.

Figure 4:
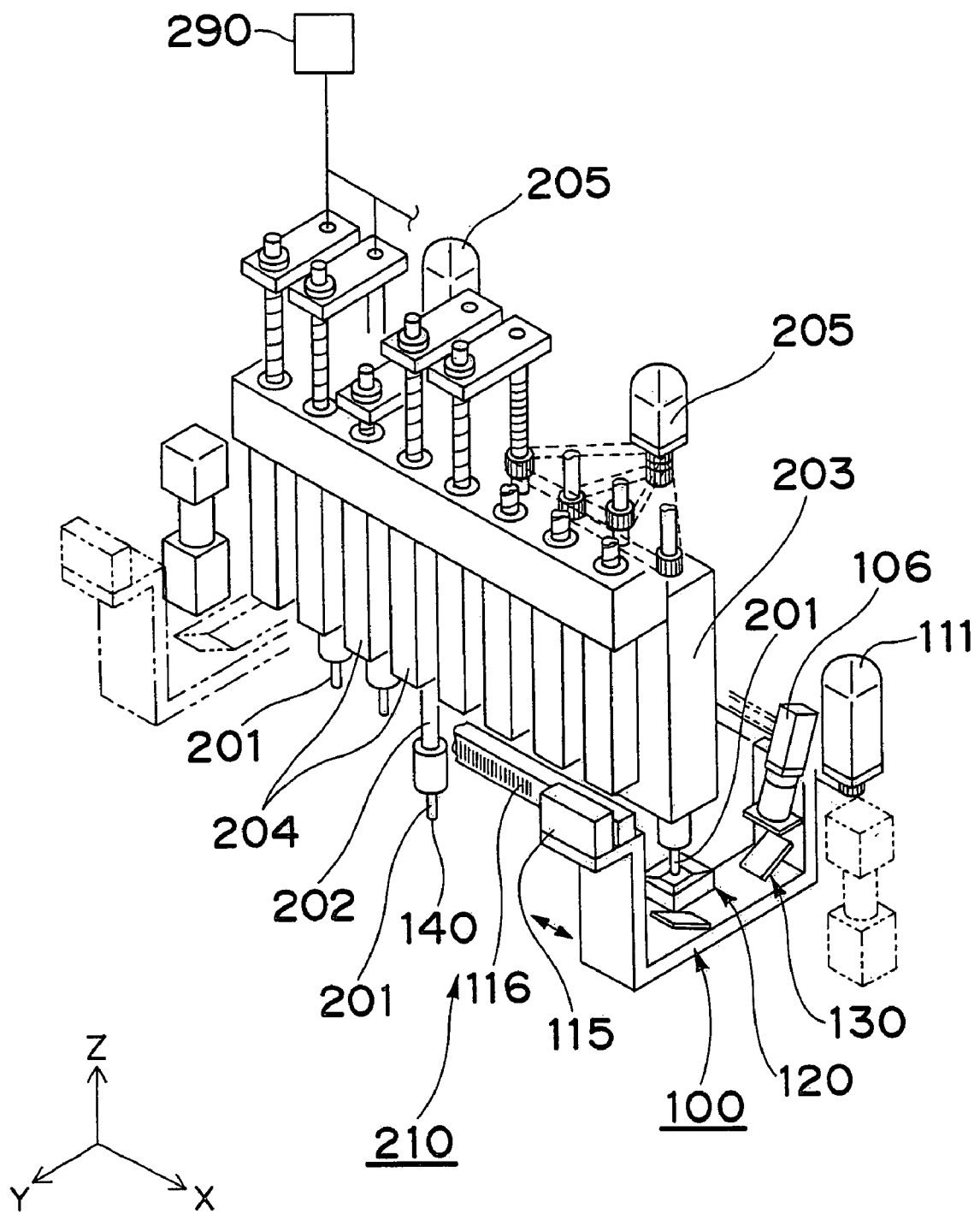
FIG. 4 is a perspective view showing a configuration of a transfer head, part in the first embodiment of the present invention.

As shown in FIG. 4, the transfer head part 210 has nozzle setting heads 202 to which suction nozzles 201, that are members as an example exerting a function of the component holder, are attached detachably, driving parts 204 for ascent and descent which move the nozzle setting heads 202 up and down along a Z-axis direction equivalent to an axial direction of the suction nozzles 201, driving parts 205 for rotation which rotate the suction nozzles 201 in a direction about an axis thereof, and the detecting device 100 for detecting whether or not the component holder is good.

According to the embodiment as is illustrated, there are eight driving parts 204 arranged in parallel with each other along the X-axis direction at a head member 203 which constitutes the transfer head part 210, and a nozzle setting head 202 is installed for the each driving part 204. In other words, a total of eight nozzle setting heads 202, that is, eight suction nozzles 201 are arranged along the X-axis direction. Four nozzle setting heads 202 are driven by one driving part 205 according to the present embodiment, and therefore a total of two driving parts 205 are installed at the head member 203. Each suction nozzle 201 is connected to a suction device 290 for sucking electronic components 312.

Similar to conventional art, each of the suction nozzles 201 is formed of a material low in reflectance or is subjected to coating for decreasing reflectance so as to prevent light reflection from the suction nozzle 201 at a time of performing image-pickup of a hold posture of electronic component 312. An entirety of the suction nozzles 201 including component hold faces are coated with a frosted black color in the present embodiment.

The number of suction nozzles 201, i.e., the number of driving parts 204 for ascent and descent, and the number of driving parts 205 for rotation are not limited to those of the present embodiment.

The detecting device 100 for detecting whether or not component holders are good includes, as indicated in FIG. 1, a nozzle detector driving part 110, an illuminating device 120, a light guide part 130, a CCD camera 106 corresponding to an example exerting a function as an image-pickup device, and the controller 150. The detecting device 100 is a device for performing an image-pickup operation of component hold face 140 of suction nozzle 201 from below the suction nozzle 201, thereby determining, based on this image-pickup information, whether or not the suction nozzle 201 is good. In the embodiment, the illuminating device 120, the light guide part 130 and the CCD camera 106 are installed to the head member 203 of the transfer head part 210 in a manner to be freely moved under each suction nozzle 201 by the nozzle detector driving part 110 along the X-axis direction.

In FIG. 1, the nozzle detector driving part 110 has a camera stage 117 where the illuminating device 120, the light guide part 130 and the CCD camera 106 are loaded and which corresponds to an example exerting a function of a detecting device supporter, a guide rail 112 attached along the X-axis direction to the head member 203 of the transfer head part 210 for supporting the camera stage 117 via a sliding member 113 and for guiding the camera stage 117 to move in the X-axis direction, a linear scale 116 fitted along the X-axis direction to the head member 203, a linear sensor 115 installed to the camera stage 117 to be opposite to the linear scale 116 for reading the linear scale 116, and a detecting device driving motor 111 operation-controlled by the controller 150 on basis of positional information obtained from the linear sensor 115 for moving and positioning the camera stage 117 in the X-axis direction. The guide rail 112, linear scale 116, linear sensor 115 and detecting device driving motor 111 correspond to a drive unit for moving the detecting device supporter in the X-axis direction corresponding to an arrangement direction of suction nozzles 201. The linear sensor 115 and the linear scale 116 constitute an example exerting a function of a position detector.

For detecting a position in the X-axis direction of the camera stage 117, the linear sensor 115 and the linear scale 116 are used in the present embodiment. However, the method is not specifically limited to these means, and control with a linear motion amount obtained by an encoder of a servomotor may be employed, although it depends on a positioning accuracy.

FIG. 1 is a view of the detecting device 100 seen from the X-axis direction in FIG. 4, in which a virtual point 161 is present on a virtual axis 160 supposed to be a parallel axis to the Z-axis which passes a center of suction nozzle 201 and nozzle setting head 202.

The camera stage 117 is set below the head member 203 and is a U-shaped member having a bottom plate 118 opposed to component hold face 140 of the suction nozzle 201. The light guide part 130 is installed between the bottom plate 118 and the component hold face 140, and the illuminating device 120 is arranged to be above the light guide part 130 and below the component hold face 140.

The illuminating device 120 is a device for shedding light onto the component hold face 140 of the suction nozzle 201 and to a light reflection face 141 which is a face opposite to a face to be held of the electronic component 312 sucked and held at the component hold face 140, and also for shedding light onto the light guide part 130. The illuminating device 120 is roughly divided into an illuminating device 120a for suction nozzles which is disposed in the vicinity of the suction nozzle 201, and an illuminating device 120b for camera which is disposed in the vicinity of a lens part 114 of the CCD camera 106. The illuminating device 120a has a plurality of light sources 121 comprising, for example, LEDs (light emitting diodes), an upper light source part 122 where light sources 121 are disposed to have optical axes made horizontal, a lower light source part 123 where light sources 121 are disposed to have optical axes inclined, and a power supply 124 connected to light sources 121 and luminance-controlled by the controller 150.

Figure 2:
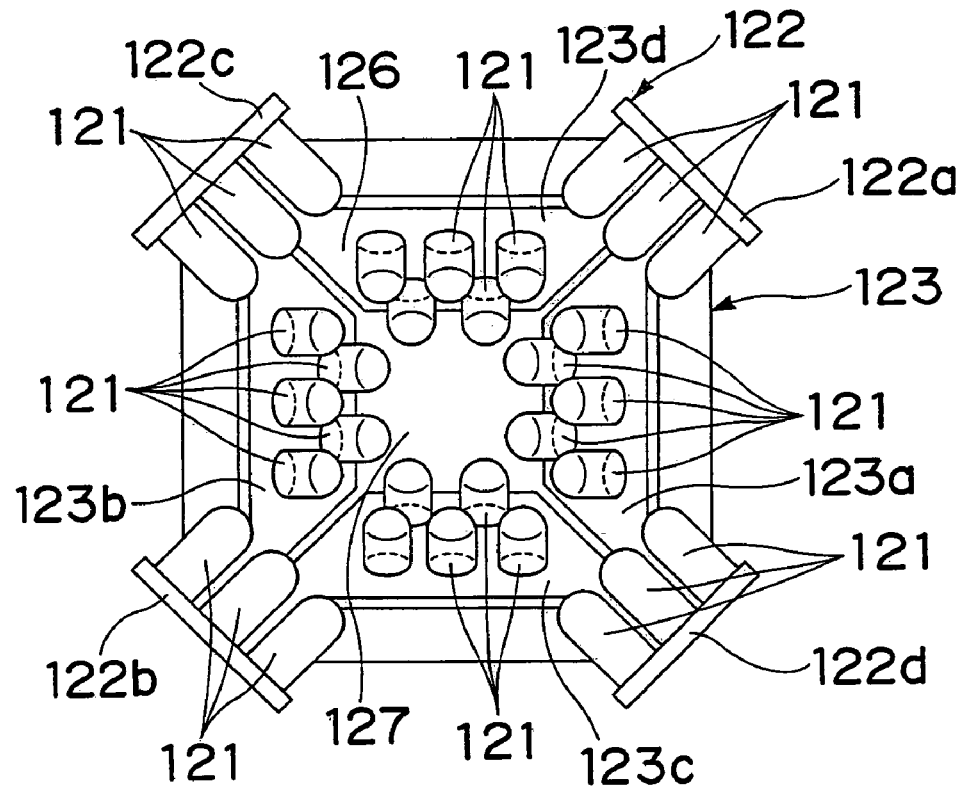
FIG. 2 is a plan view of an illuminating device for the suction nozzle of the detecting device shown in FIG. 1.

The lower light source part 123 has a lower first support member 123a and a lower second support member 123b inclined and opposed to each other, and a lower third support member 123c and a lower fourth support member 123d inclined and opposed to each other as shown in FIG. 2 so that a large square aperture 126 having a large area is formed at a position at a side of the component hold face 140 of the suction nozzle 201, and a small square aperture 127 having a small area is formed at a position at a side of the light guide part 130. The lower first support member 123a, the lower second support member 123b, the lower third support member 123c and the lower fourth support member 123d are inclined by an angle of 45 degrees relative to a horizontal direction. The lower first support member 123a, the lower second support member 123b, the lower third support member 123c and the lower fourth support member 123d form a roughly mortar-like shape. The lower light source part 123 is fixed to the camera stage 117 so that centers of the large aperture 126 and the small aperture 127 are present on the virtual axis 160 as the center of the suction nozzle 201.

Also as indicated in FIG. 2, each of the lower first support member 123a, the lower second support member 123b, the lower third support member 123c and the lower fourth support member 123d has three light sources 121 installed at equal intervals near a center of each member, and two light sources 121 interposed between the three light sources 121 to be parallel to an arrangement direction of the three light sources 121. Five light sources are installed in all. Each light source 121 is set to have its optical axis orthogonal to a corresponding lower support member 123 to which the light source 121 is fitted. By this arrangement, illumination light by each of light sources 121 set in the lower first support member 123a, the lower second support member 123b, the lower third support member 123c and the lower fourth support member 123d is concentrated to the vicinity of the virtual point 161 on the virtual axis 160.

Although the number of light sources 121 installed in each of the lower support members is five, the number is not specified and is changeable in accordance with a distance between the component hold face 140 of the suction nozzle 201 and the light reflection face 141 of the electronic component 312 to be illuminated by the light sources 121.

The upper light source part 122 is disposed between the large square aperture 126 formed in the roughly mortar-like shape by the lower light source part 123 and the component hold face 140 of the suction nozzle 201. As shown in FIG. 2, the upper light source part 122 has an upper first support member 122a and an upper second support member 122b arranged opposite each other, and an upper third support member 122c and an upper fourth support member 122d arranged opposite each other on diagonals at four corners of the large aperture 126. Each of the upper first support member 122a, the upper second support member, the upper third support member and the upper fourth support member has three light sources 121 fitted at equal intervals in the vicinity of a center of each member so that optical axes of each source extends in a horizontal direction. This arrangement also makes illumination light by each light source 121 of the upper light source part 122 concentrated to the vicinity of the virtual point 161 on the virtual axis 160.

While the number of light sources 121 fitted to the upper first support members, which constitutes the upper light source part 122 is three in the present embodiment, the number is not specified and is changeable according to a distance between the component hold face 140 of the suction nozzle 201 and the light reflection face 141 of the electronic component 312 to be illuminated by the light sources 121.

Figure 3:
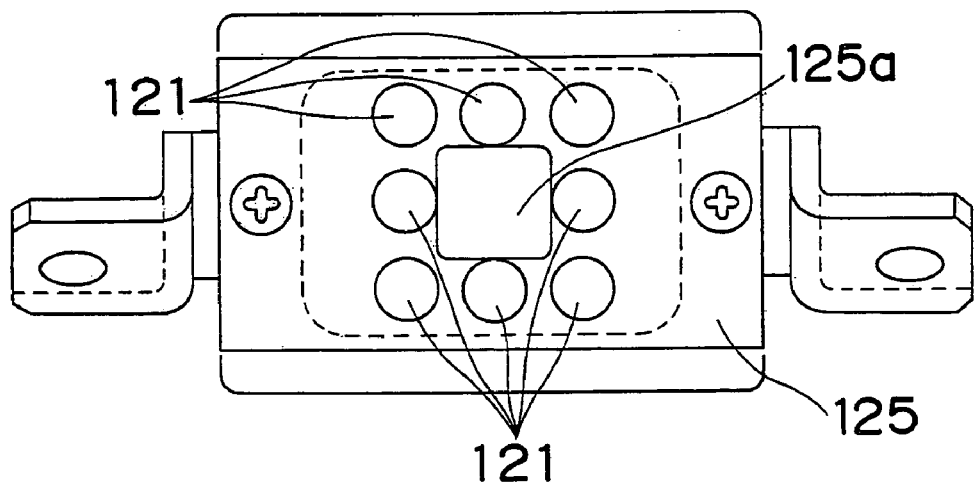
FIG. 3 is a diagram showing a lens part light source support member included in the detecting device of FIG. 1.

The illuminating device 120b for camera has a plurality of the light sources 121, a lens part light source support member 125 to which the light sources are fitted, and power supply 124 connected to the light sources 121 and luminance-controlled by the controller 150. As shown in FIG. 3, the lens part light source support member 125 has an aperture 125a near a center thereof for passing light entering the lens part 114 of the CCD camera 106, and eight light sources 121 fitted at equal intervals along a periphery of the aperture 125a. The eight light sources 121 are fitted so that optical axes of the light sources 121 are orthogonal to the lens part light source support member 125. Therefore, illumination light by the light sources 121 fitted to the lens part light source support member 125 is irradiated towards the light guide part 130. The CCD camera 106 is a device for performing image-pickup of the component hold face 140 of the suction nozzle 201 and the light reflection face 141 of the electronic component 312, and is connected to the controller 150.

While the number of light sources 121 fitted to the lens part light source support member 125 is eight in the embodiment, the number is not specified and can be changed depending on a distance between the component hold face 140 of the suction nozzle 201 and the light reflection face 141 of the electronic component 312 to be illuminated by the light sources 121. Moreover, although the present embodiment uses the CCD camera 106, the embodiment is not limited to the CCD camera 106 so long as image-pickup of the component hold face 140 and the light reflection face 141 can be performed. For example, an optical camera, a line sensor, a two-dimensional sensor, a three-dimensional sensor or the like can be used.

The light guide part 130 is a constituent part for guiding images of the component hold face 140 of the suction nozzle 201 and the light reflection face 141 of the electronic component 312 to the lens part 114 of the CCD camera 106, which includes a first reflecting mirror 131 arranged near the virtual axis 160 and a second reflecting mirror 132 arranged away from the first reflecting mirror 131 in the Y-axis direction. According to the embodiment, the first reflecting mirror 131 is disposed in a state while inclined by 45 degrees from a horizontal state in a clockwise direction about the X-axis so as to image the component hold face 140 and the light reflection face 141. The second reflecting mirror 132 is inclined by 25 degrees from a horizontal state in a counterclockwise direction about the X-axis and is disposed to a position where this mirror receives light from the illuminating device 120b for camera. The CCD camera 106 disposed not to be opposite the component hold face 140 is hence enabled to image the component hold face 140 and the light reflection face 141 via the light guide part 130.

While an image-pickup operation is performed with use of the light guide part 130 in the instant embodiment, the light guide part 130 can be omitted if the CCD camera 106 can be disposed to be opposite the component hold face 140. A number of reflecting mirrors for constituting the light guide part 130 can be changed depending on an arrangement state of the CCD camera 106.

An image-pickup operation of suction nozzle 201 by the illuminating device 120, the light guide part 130 and the CCD camera 106 constituted as above will be described herein. Initially, light sources 121 installed in the upper light source part 122 and the lower light source part 123 shine light on the suction nozzle 201. As a result, a reflecting light 135 reflected at the component hold face 140 of the suction nozzle 201 travels in the Z-direction towards the first reflecting mirror 131. The reflecting light 135 is changed by 90 degrees in terms of a traveling angle by the first reflecting mirror 131 to travel further in the Y-direction towards the second reflecting mirror 132. Moreover, the reflecting light 135 has its traveling direction changed by 130 degrees by the second reflecting mirror 132 and enters the lens part 114 of the CCD camera 106. Imaging information sent out from the CCD camera 106 is temporarily stored in the controller 150.

The reflecting light 135 traveling from the second reflecting mirror 132 to the lens part 114 is adapted to enter by an angle of 85 degrees to the lens part 114 face so as not to be reflected regularly to the lens part 114 of the CCD camera 106.

Figure 6:
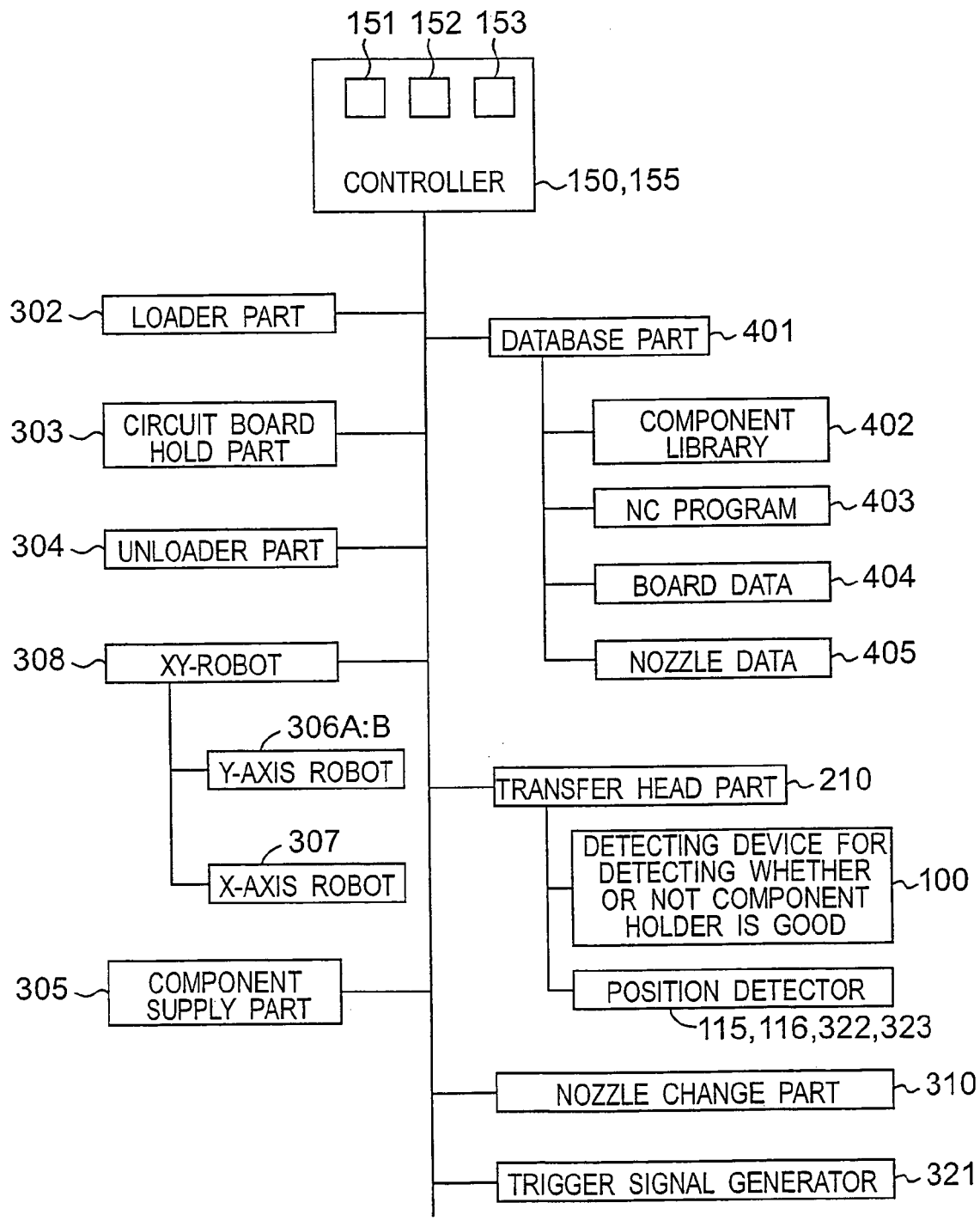
FIG. 6 is a diagram showing a configuration of a controller of the electronic component mounting apparatus with the detecting device in the first embodiment of the present invention.

The controller 150 will be discussed now. As shown in FIG. 6, the controller 150 is connected to the loader part 302, the circuit board hold part 303, the unloader part 304, the XY-robot 308, the first component supply part 305A, the second component supply part 305B, the third component supply part 305C, the transfer head part 210, the suction nozzle changer 310 and a database part 401. The database part 401 has a component library 402, an NC program 403, board data 404 and nozzle data 405 stored therein. The component library 402 has data on shapes of various kinds of electronic components 312 and is used in detecting a positional deviation in a suction operation of an electronic component through comparison with image-pickup information to be described later. The NC program 403 is a program for driving each device of the component mounting apparatus 300. The board data 404 has shape data of various electronic circuit boards 301 and positional data of various electronic components 312 to be mounted. The nozzle data 405 is data for sending to the suction nozzle changer 310 or the like, an instruction of which of various suction nozzles 201 are to be used for various electronic components 312 to be held.

Although detailed in an operational description below, according to the present embodiment, the controller 150 also has a deciding device 151 for determining whether or not the suction nozzle 201 is good on basis of luminance of component hold face 140 in image-pickup information of the component hold face 140 of suction nozzle 201 supplied from the CCD camera 106, and also on basis of the image-pickup information itself. The deciding device 151 has a storage part 152 in which a setting value, set on basis of total luminance by reflection from the electronic component 312 and the component hold face 140 when the illuminating device 120 emits light in a state with the electronic component 312 being held at the component hold face 140, is stored. The deciding device 151 decides that the suction nozzle 201 is defective when luminance at the component hold face 140 in a state without the component being held is not smaller than the setting value. The storage part 152 may be installed in the controller 150.

The deciding device 151 has regional information related to a plurality of sections formed by dividing the component hold face 140, and determines for every section whether or not the luminance is not smaller than the setting value. The storage part 152 may store the regional information.

When the luminance is smaller than the setting value and if an image corresponding to the electronic component 312 is recognized within image-pickup information of the component hold face 140 supplied from the CCD camera 106, the deciding device 151 can decide that the suction nozzle 201 is defective.

The deciding device 151 may contain information, related to an image of electronic component 312 recognized within the image-pickup information of component hold face 140, in the storage part 152. The image-pickup information at this time is preferably of such a size not larger than a minimum component to be held by the suction nozzle 201.

The controller 150 can operationally-control the illuminating device 120 so that the illuminating device 120 emits light to the suction nozzle 201 by an amount of light for inspection which exceeds a maximum amount of light at a time when the illuminating device emits light to the electronic component 312 and the component hold face 140 in a state while the electronic component 312 is held at the component hold face 140.

In the present embodiment as described above, the detecting device 100 for component holders is installed at the transfer head 210 included in the component mounting apparatus 300. However, the detecting device 100 can be constituted separately from the component mounting apparatus 300.

While an operation in the above-constituted component mounting apparatus 300 will be described below, one of operational characteristics of the present embodiment is a detection operation of deciding whether or not the suction nozzle 201 is good, on basis of luminance or the like of the component hold face 140 of the suction nozzle 201, by light emission of the illuminating device 120, and therefore the detection operation in the component mounting apparatus 300 will be primarily described herein. The detection operation and the component mounting operation are both operationally-controlled and performed by the controller 150.

In the component mounting apparatus 300, the detection operation for the suction nozzle 201 is executed before a component mounting operation of the electronic component 312 to the circuit board 301 is started or after a component mounting operation is performed a predetermined number of times.

Figure 7:
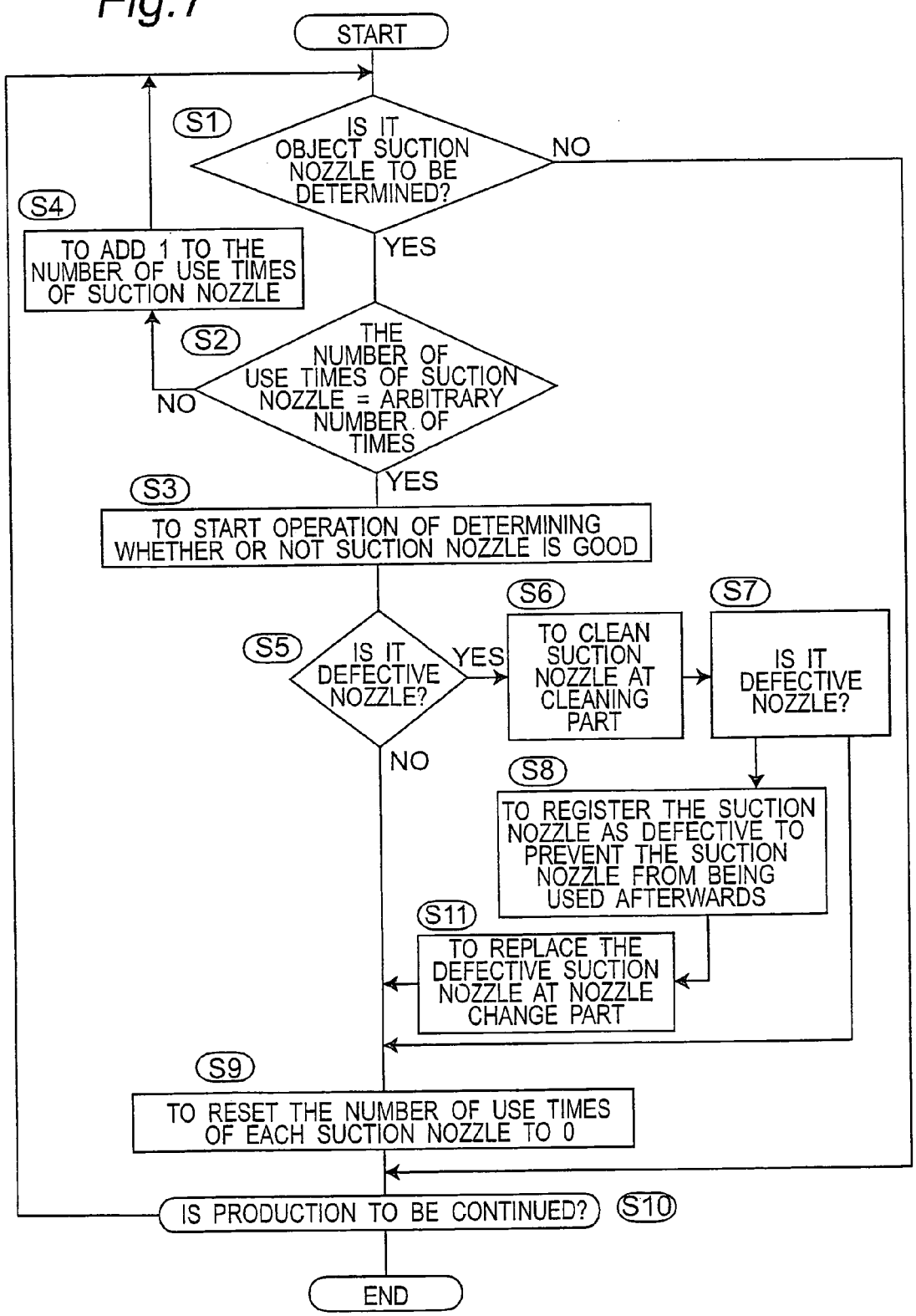
FIG. 7 is a flow chart diagram of the electronic component mounting apparatus with the detecting device in the first embodiment of the present invention.

The detecting device 100 determines that a suction nozzle 201 having light reflectance at the component hold face 140 increased because of adhesion of metals of electronic component 312 to the component hold face 140 of the suction nozzle 201, or by peeling of a coating at the component hold face 140, is a defective one. The detection operation for the suction nozzle 201 will be discussed with reference to FIG. 7.

In step 1, it is determined for a suction nozzle 201 to be inspected whether or not it is an object nozzle to be decided. In other words, in step 1, it is determined whether component hold face 140 of the suction nozzle 201 is larger than or nearly equal in terms of area to light reflection face 141 which is opposite to a face to be held of electronic component 312 by the suction nozzle 201 and reflects light emitted from the illuminating device 120. A decision of whether or not the suction nozzle 201 is good is performed when the component hold face 140 is larger than or nearly equal to the light reflection face 141.

As indicated in FIG. 8, for example, each of an SX nozzle as a suction nozzle 201 for electronic components such as 0.6×0.5 mm capacitors or resistors, an SA nozzle as a suction nozzle 201 for electronic components such as 10.0×0.5 mm capacitors or resistors, or SS mini transistors, an S nozzle as a suction nozzle 201 for electronic components such as 1.6× 0.8 mm capacitors or resistors, 2.0×1.25 mm capacitors or resistors, or 2×2.1 mm S mini transistors, and an M nozzle as a suction nozzle 201 for 6×3.5 mm tantalum capacitors, 4.5× 3.8 mm trimming potentiometers or 4.3×4.3 mm alumina electrolytic capacitors, has a component hold face 140 larger than or nearly equal to light reflection face 141 of an electronic component to be held, and therefore is subjected to a determination as to whether or not the suction nozzle 201 is good. On the other hand, an L nozzle as a suction nozzle 201 for SOPs having dimensions of 7.6 mm or larger or QFPs having dimensions of 12 mm or larger, has a component hold face 140 smaller than light reflection face 141 of the electronic component, and therefore is not subjected to a determination as to whether or not the suction nozzle 201 is good.

By way of example, the component hold face of the SX nozzle is 0.6×0.5 mm, that of the SA nozzle is 1.0×0.8 mm, that of the S nozzle is 1.7×1.2 mm and that of the M nozzle is 4.0×3.4 mm.

When it is not necessary to take into account effects of reflecting light of the component hold face 140 during an operation of recognizing a suction posture of an electronic component 312, a determination of good or not for the suction nozzle 201 may be performed even if the suction nozzle 201 has the component hold face 140 smaller than the light reflection face 141 of the electronic component 312. For instance, in a case where some stain adheres to the component hold face 140 of the suction nozzle 201 to cause a suction failure, and for a purpose of preventing such trouble, the component hold faces 140 of all suction nozzles 201 may be subjected to a determination of good or not regardless of sizes of the component hold face 140 and the light reflection face 141.

The detection operation proceeds from step 1 to step 2 when the suction nozzle is decided as an inspection object. The detection operation proceeds from step 1 to step 10 when the suction nozzle is decided as a non-inspection object. The detection operation returns from step 10 to step 1 when the component mounting operation is to be continued, or the detection operation is terminated when a component mounting operation is not to be continued.

Since an increase of light reflectance at the component hold face 140 is proportional to the number of employed suction nozzle 201, it is decided in step 2 whether or not the number of employed suction nozzles 201 to be inspected reaches a setting number. Unless this number of employment reaches the setting number, the detection operation proceeds to step 4, where 1 is added to the number of employment. After a mounting operation is performed, the detection operation returns to step 1. In the meantime, if the number of employment of even one of eight suction nozzles 201 in the embodiment of the transfer head 210 reaches the setting number, the detection operation proceeds to step 3, and the detecting device 100 is activated to decide whether or not the suction nozzle is good. Whether a suction nozzle is defective or not is discriminated in step 5.

Hereinbelow will be described a determination operation of good or bad for a suction nozzle by the detecting device 100.

As shown in FIG. 9, in a state where electronic component 312 corresponding to a suction nozzle 650, of the same kind as the suction nozzle 201 to be inspected, is sucked to a normal component hold face 651 having no adhesion of metals or the like thereto or without any peeling of a coating for suppressing light reflection, light is emitted by the illuminating device 120 and then an image pickup operation is performed by the CCD camera 106. At this time, the illuminating device 120 emits light with a maximum amount of light in a necessary amount of light for performing an image-pickup operation of a suction posture of the electronic component. Obtained image-pickup information is sent from the CCD camera 106 to the controller 150. For improving inspection accuracy more, light can be emitted with an amount of light for inspection exceeding the maximum amount of light. An amount of light for inspection is approximately 110-120% of the maximum amount of light in an example.

The controller 150 measures a total luminance by reflection from light reflection face 141 of the electronic component 312 held by the suction nozzle 650 and the component hold face 651 of the suction nozzle 650. Since the electronic component 312 normally reflects light considerably greatly in comparison with the component hold face 651, total luminance can be normally regarded as a luminance mostly from the electronic component 312. In measuring the luminance, luminance at an entire face of the component hold face 651 may be measured, or luminance at a setting range 610 shown in FIG. 9 may be measured. The setting range 610 is equal or nearly equal in size to an electronic component to be held. Specifically, the setting range is smaller by 10-30% than the component hold face of the suction nozzle. Numeral 604 in FIG. 9 indicates a suction hole in the suction nozzle 650.

A maximum value of a measured total luminance is set as an upper limit threshold, and a luminance slightly smaller than the upper limit threshold is set as a setting value 652 for determining whether or not the suction nozzle is good. The setting value is stored in the storage part 152. When the luminance is expressed by a 256-level gray scale by way of example as shown in FIG. 10, the setting value 652 may be decided to be, for example, a 100-gradation level on basis of a 120-gradation level as an example of the upper limit threshold. The 120-gradation level corresponds to the total luminance.

The above setting value 652 is decided for each of various kinds of suction nozzles before the determination operation of good or bad for the suction nozzle is performed, and each setting value 652 is stored.

Subsequently, an image-pickup operation of the component hold face 141 of the suction nozzle 201 is performed, and whether the suction nozzle 201 is good or not is determined on basis of the image-pickup information. More specifically, since the transfer head part 210 has a plurality of suction nozzles 201 in the present embodiment, it is necessary to position the camera stage 117 including the illuminating device 120, the light guide part 130 and the CCD camera 106 relative to each of the suction nozzles 201. In other words, the camera stage 117 is moved in the X-axis direction by the inspecting device driving motor 111, thereby positioning virtual axis 160 as a center of suction nozzle 201 relative to centers of the large aperture 126 and the small aperture 127 of the lower light source part 123 on basis of positional information detected by the linear scale 116 and the linear sensor 115. An image of the component hold face 140 of the suction nozzle 201 when positioned as above is guided to the CCD camera 106 through the light guide part 130.

The image-pickup of the component hold face 140 is performed by light emission from the illuminating device 120 by a maximum amount of light or by an amount of light for inspection. Luminance of the component hold face 140 is measured by the deciding device 151 on basis of the image-pickup information, and whether or not this measured value is not smaller than the setting value 652 is determined. Since light reflection at the component hold face 140 is large when the measured value is not smaller than the setting value 652, it is conceivable that metals such as solder of the electronic component 312 adhere or a coating is peeled away, whereby the suction nozzle 201 is determined as defective. On the other hand, when the measured value is smaller than the setting value 652, the suction nozzle 201 is determined as normal.

The camera stage 117 may be stopped every time the virtual axis 160 is positioned relative to the lower light source part 123 and the upper light source part 122 for each suction nozzle 201. However, for shortening inspecting time, it is preferred to move the camera stage 117 in the X-axis direction without stopping, and activate the illuminating device 120 and the CCD camera 106 on basis of positional information detected by the linear scale 116 and the linear sensor 115 when the virtual axis 160 is positioned at the centers of the lower light source part 123 and the upper light source part 122 to determine whether or not the suction nozzle 201 is good. In this case, the CCD camera 106 preferably has a shutter function and drives a shutter to perform image-pickup when the virtual axis is positioned as above.

Figure 11:
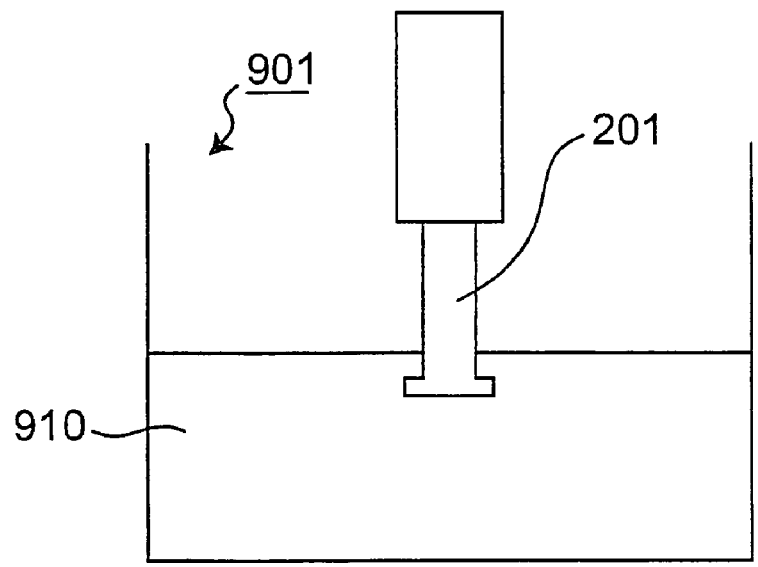
FIG. 11 is a diagram showing a state in which the component hold face of the suction nozzle soaks in a solvent of a solvent bath part in a cleaning device.
Figure 12:
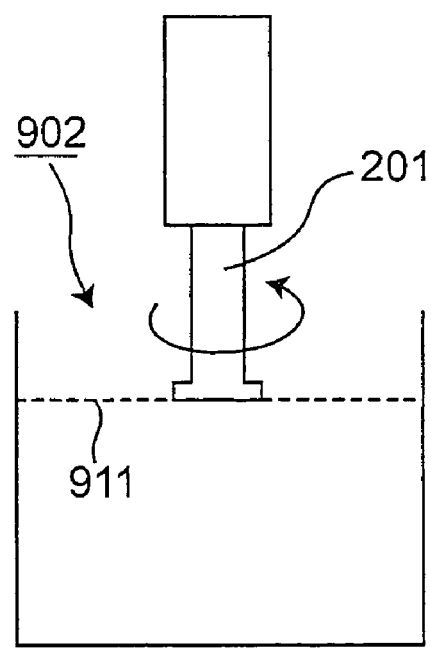
FIG. 12 is a diagram showing a state in which the component hold face of the suction nozzle is pressed against a liquid absorber of a solvent wiping part in the cleaning device.
Figure 13:
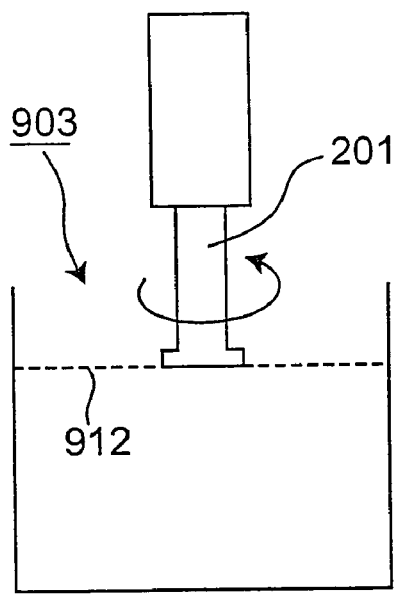
FIG. 13 is a diagram showing a state in which the component hold face of the suction nozzle is pressed against a contamination wiper of a finishing part in the cleaning device.

As described above, the transfer head part 210 has a plurality of suction nozzles 201 installed thereto in the present embodiment. The detection operation proceeds to step 6 when at least one of the plurality of suction nozzles 201 is determined as defective, and then only defective nozzle(s) or all suction nozzles 201 are cleaned by the cleaning device 311. An example of a cleaning method will be described with reference to FIGS. 11-13. The cleaning method corresponds to an example of a luminance reduction process performed for the component hold face 140 of the suction nozzle 201.

After the transfer head part 210 is moved by the XY-robot 308 to the solvent bath part 901 of the cleaning device 311, only defective nozzle(s) or all suction nozzles 201 are moved down by operation of the driving parts 204 for ascent and descent, whereby the component hold faces 140 are soaked for approximately ten seconds in the solvent 910 such as ethanol or isopropyl alcohol filled in the solvent bath part 901. Description of a succeeding process and thereafter will be directed to a case of cleaning all suction nozzles 201. Subsequently, the suction nozzles 201 are moved by the XY-robot 308 to the solvent wiping part 902. After this movement, driving parts 204 for ascent and descent are driven to press down the component hold faces 140 by approximately 0.1 mm onto water-absorbing waste attached at the wiping part 902. Further in this state, driving parts 205 for rotation are driven to rotate the component hold faces 140 approximately three times, thereby wiping off the solvent 910. Finally, after the suction nozzles 201 are moved by the XY-robot 308 to the finishing part 903, the driving parts 204 for ascent and descent are driven to press the component hold faces 140 by approximately 0.1 mm down onto chamois leather attached at the finishing part 903. The driving parts 205 for rotation are driven in this state to rotate the component hold faces 140 approximately three times as a finishing operation of this wiping.

After the above cleaning operation, the detection operation proceeds to step 7, in which it is determined, similar to the aforementioned step 5 whether or not each suction nozzle 201 is good. The detection operation proceeds to step 8 when even one of the suction nozzles 201 is determined again as defective.

Meanwhile, when no defective nozzle is detected in step 7, the detection operation proceeds to step 9, where the number of employment of each suction nozzle 201 is reset to 0. When no defective nozzle is detected in step 5, similarly, the detection operation proceeds to step 9 and then to step 10.

In step 8, the suction nozzle 201 determined again as defective is registered as a defective nozzle to be prevented from being used at a component mounting operation afterwards. At the same time, a warning is generated and the detection operation proceeds to step 11 to exchange the nozzle by the nozzle changer 310.

In step 11, the transfer head 210 is moved by the XY-robot 308 to the suction nozzle changer 310, and only the defective nozzle(s) or all suction nozzles 201 are automatically detached and replaced by the suction nozzle changer 310 having spare nozzles 313. After finishing step 11, the detection operation returns to step 9.

As described hereinabove, according to the present embodiment, whether or not the suction nozzle 201 is good can be automatically determined by measuring luminance of the component hold face 140 of the suction nozzle 201 by the detecting device 100. Therefore, such trouble can be avoided that light reflection by the component hold face 140 affects correct recognition of a state with the electronic component 312 held by the suction nozzle 201.

Moreover, according to the present embodiment, the detecting device 100 is installed at the transfer head part 210 and, whether or not the suction nozzle 201 is good is determined by moving the camera stage 117 with the illuminating device 120, the light guide part 130 and the CCD camera 106 below the suction nozzle 201. Therefore, it becomes unnecessary to move the transfer head part 210 to, for example, a recognition device installed in the component mounting apparatus to perform image-pickup of a component hold posture at a suction nozzle. A time required for inspecting whether or not the suction nozzle 201 is good and for recognizing components can be shortened in comparison with the conventional art.

In the component mounting apparatus 300 of the present embodiment, a defective nozzle when detected by the detecting device 100 can be automatically cleaned by the cleaning device 311. The defective nozzle can be renewed accordingly. In addition, by providing the suction nozzle changer 310, a suction nozzle if determined as defective even after being cleaned can be automatically replaced with a normal suction nozzle 201, thereby enabling increasing availability of the component mounting apparatus 300.

A modified example in relation to the detecting device 100 will be described below.

The setting value 652 is a value decided on the basis of the total luminance in a state with the electronic component 312 held at the suction nozzle 650 as depicted above. How to decide the setting value 652 is not limited to this method, and the setting value can be decided, for example, by the following method. Concretely, luminance of the component hold face 140 is measured with a fresh suction nozzle which is completely free from adhesion of contamination by electronic component 312 to the component hold face 140 and at the same time, which has no peeling off of a coating. The luminance is set as a lower limit setting value. Theoretically, it is so considered that some adhesion of contamination or peeling off of the coating is present at the component hold face 140 of the suction nozzle if a luminance of the component hold face 140 measured exceeds the lower limit setting value. Therefore, by deciding a luminance value exceeding the lower limit setting value and smaller than the earlier-described setting value 652 as a threshold, unnecessary light reflection at the component hold face 140 can be detected with a higher accuracy as compared with a case when the setting value is decided to be the 100-gradation level.

Figure 14:
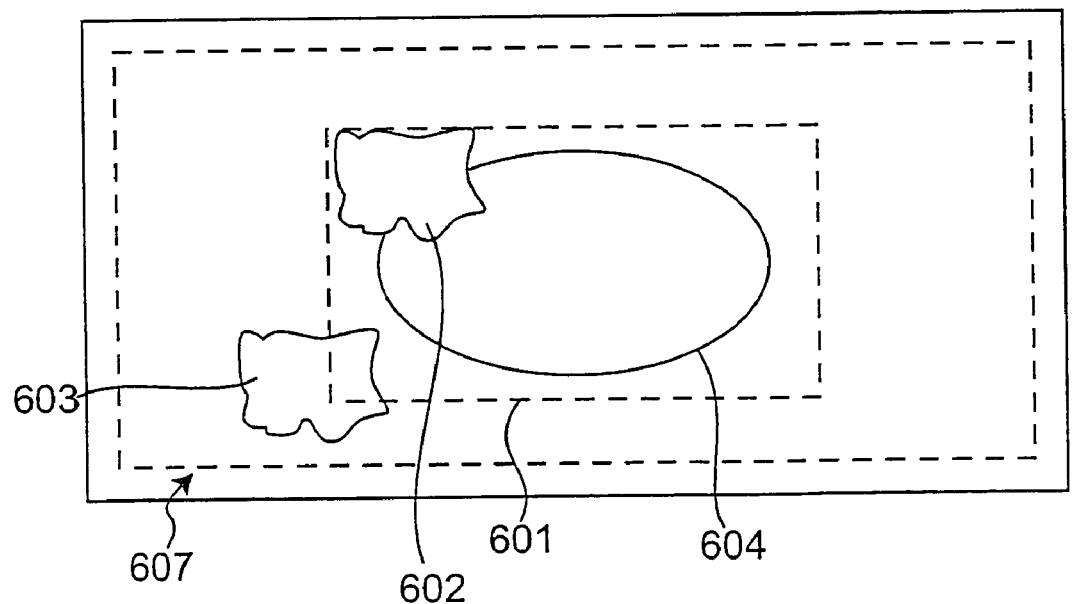
FIG. 14 is a diagram showing an image-pickup state in measuring luminance at the component hold face in a state with adhesion of metals, or the like contamination, present at the component hold face of the suction nozzle without sucking a component.

As above, according to the method of measuring luminance of the component hold face 140 at the suction nozzle 201 to be inspected, it is difficult in some cases to distinguish minute contamination or peeling off of a coating of the component hold face 140 which possibly leads to wrong detection of a suction posture of electronic component 312 from that of the component hold face 140, which never causes wrong detection of the suction posture. More specifically, as shown in FIG. 14, the method of detecting luminance of the component hold face 140 cannot distinguish a case where a contamination or the like 603, of a size such that a suction posture is possibly detected wrong, is present at a non-cover region 607 other than a region 601 covered with the electronic component 312, from a case where contamination or the like 602 of a size similar to the size of the above contamination or the like 603 is present within the region 601 when the electronic component 312 is held at the component hold face 140. That is, since the contamination or the like 602 is covered and hidden by the electronic component 312 during a component recognition operation, adverse effects onto the detection of the suction posture are eliminated even if there is the contamination or the like 602 within the region 601. By the way, the contaminations or the like 602 and 603 are higher in luminance than parts without contamination or the like at the component hold face 140. The same is true for contaminations or the like 606 and 608 to be described below.

Figure 15:
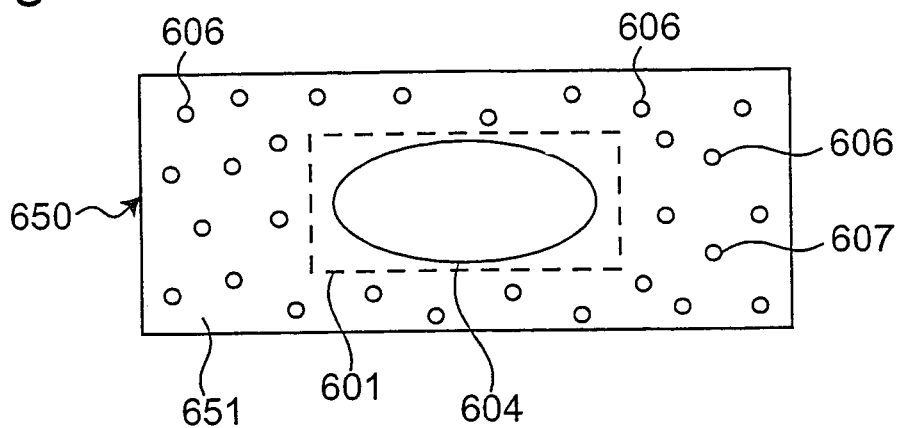
FIG. 15 is a diagram showing an image-pickup state in measuring luminance at the component hold face in a state with adhesion of metals, or the like minute contamination, present at the component hold face of the suction nozzle without sucking a component.

As indicated in FIG. 15, it is undistinguishable between a case where countless minute contaminations or the like 606 which do not lead to wrong detection of a suction posture is spotted on the component hold face 140 and consequently a luminance resulting from the contamination or the like 606 is averaged to reach the same level as that of the contamination or the like 603 which causes wrong detection of the suction posture, and a case where luminance is simply caused by the contamination or the like 603. In other words, such trouble is that even minute contamination or the like 606 not to lead to wrong detection of the suction posture is detected when it is tried to detect the contamination or the like 603 of the component hold face 140, which possibly causes wrong detection of the suction posture.

Figure 16:
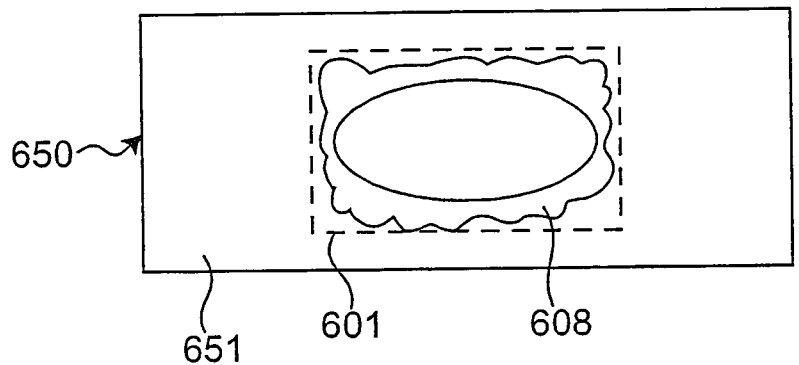
FIG. 16 is a diagram showing an image-pickup state in measuring luminance at the component hold face in a state where adhesion of metals, or the like contamination, to the component hold face of the suction nozzle without sucking a component is present in a region to be hidden by a sucked electronic component.

As above, the method of measuring luminance of an entire component hold face 140 is preferred for large contamination or the like 608 as shown in FIG. 16, which brings about a misjudgment in that an electronic component is held by the suction nozzle 210 although the electronic component is actually not held by the suction nozzle because of an effect of light reflection caused by contamination or the like of the component hold face 140. However, the method is not suitable to detect the contamination or the like 603 which possibly leads to wrong detection of the suction posture.

Figure 17:
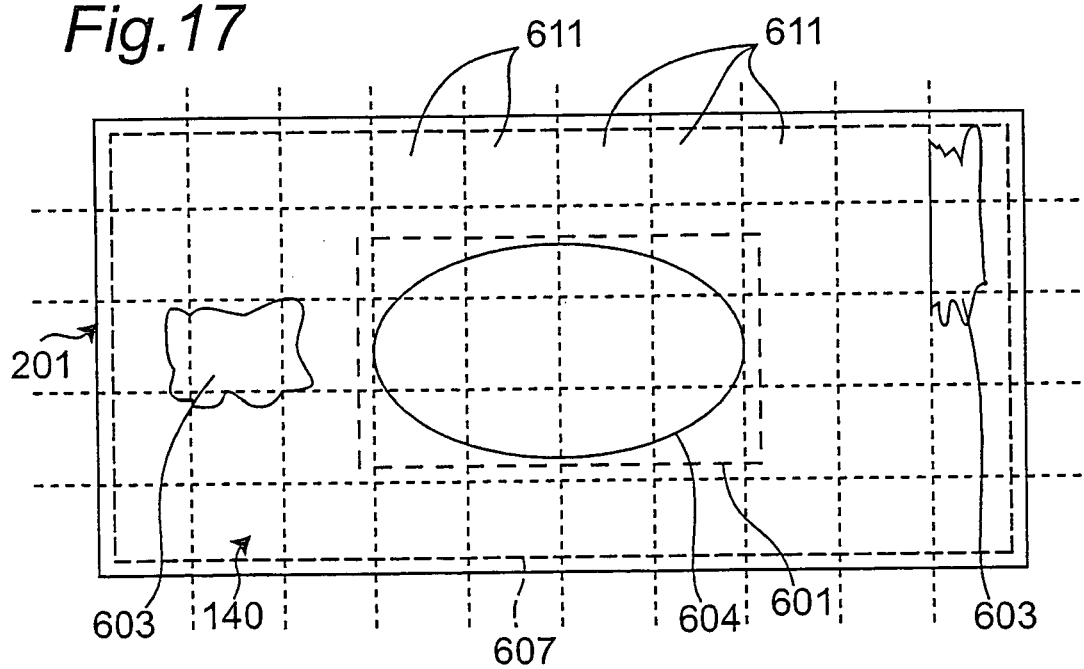
FIG. 17 is a diagram in which the image-pickup state in measuring luminance at the component hold face in a state with the adhesion of metals, or the like contamination, present at the component hold face of the suction nozzle without sucking the component is divided into each of sections.

For solving this problem, a method to be described below can be adopted as a modified example. Specifically, image-pickup information used in measuring luminance is divided into a grid pattern as indicated in FIG. 17. Component hold face 140 having, e.g., a long side of 1.0 mm and a short side of 0.5 mm is divided into, for example, fifty sections. A threshold luminance value is set for each divided section 611 beforehand. A range of region 601 is preliminarily stored in the nozzle data 405 in the controller 150. Since the region 601 is covered with electronic component 312, the nozzle is not determined as a defective nozzle even if luminance of not smaller than a threshold is detected at one or a plurality of sections 611 within the region 601.

On the other hand, the suction nozzle 201 is determined as a defective one when luminance not smaller than the threshold is detected at one or a plurality of sections 611 in the non-cover region 607 other than the region 601.

Only minute contamination or the like 603 which affects a suction posture of the electronic component 312 can thus be correctly detected by dividing image-pickup data used in luminance detection into a grid pattern, thereby determining whether or not a suction nozzle is good. The suction nozzle can be prevented from being unnecessarily determined as a defective one.

Both of the above methods of measuring luminance of the entire component hold face 140, and of measuring luminance of each section 611 after dividing the component hold face 140 into the grid pattern, are to determine whether or not the suction nozzle 201 is good by measuring the luminance based on imaging information of the component hold face 140. However, how to determine whether or not the suction nozzle 201 is good is not limited to these methods. This determination may be performed by not only measuring luminance, but by taking image-pickup information of the component hold face 140 into account. That is, if an image corresponding to a component is recognized within image-pickup information of the component hold face 140 at a time when image-pickup of the component hold face 140 without holding electronic component 312 is performed, suction nozzle 201 may be determined as a defective one even though the suction nozzle is determined as normal by the foregoing luminance measurement.

Figure 18:
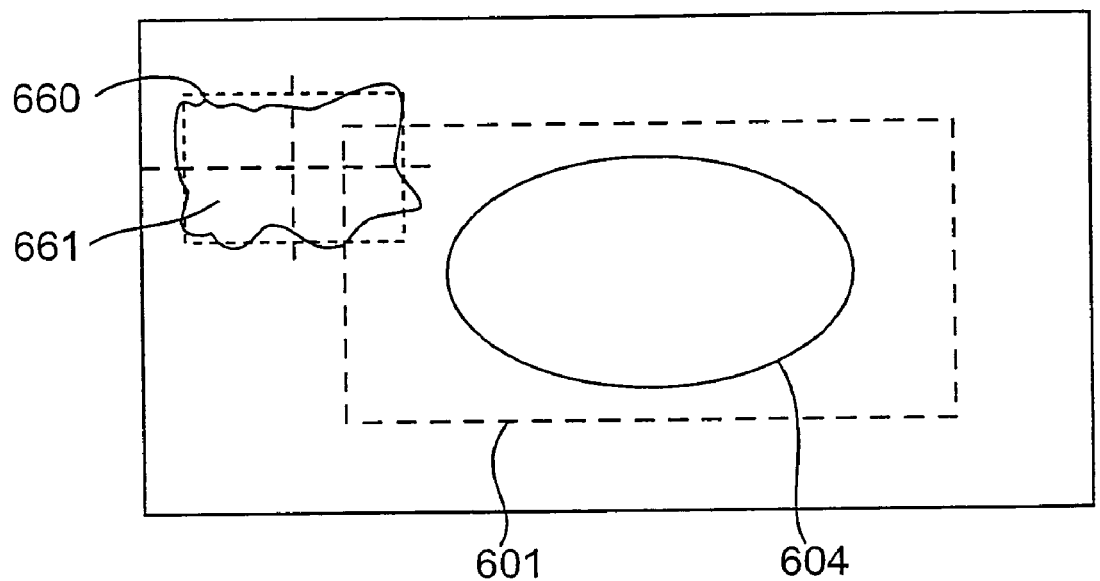
FIG. 18 is a diagram showing an image-pickup state at the component hold face in a state with adhesion of metals, or the like contamination, present at the component hold face of the suction nozzle without sucking a component, and an area stored in the controller.

In this case, as a component corresponding to an image recognized within the image-pickup information of the component hold face 140, image information 660 as shown in FIG. 18 of a minimum component, having a smallest area from among electronic components to be held by suction nozzle 201 to be inspected, is selected and stored into the storage part 152 of the controller 150 from the component library 402 which is shape data of object electronic components within the controller 150. Therefore, if image information 661 approximately equivalent to the image information 660 is confirmed in the image-pickup information when image-pickup of the component hold face 140 of object suction nozzle 201 for holding an object electronic component is performed in a state without the object electronic component being sucked, the object suction nozzle 201 can be determined as defective.

According to this method, accuracy for determining whether or not the suction nozzle 201 is good can be further improved, and at the same time, a state without a component sucked can be prevented from being recognized as wrong, as if the component were sucked.

Furthermore, image information having, for instance, 90-10% of an area indicated by the stored image information 660 may be used as a criterion of this determination. For instance, if an area corresponding to 10% of the area of the image information 660 is made the criterion, minute contaminations and flaws can be detected with a higher accuracy, thereby enabling avoiding wrong detection also in detecting a suction posture of sucked electronic components 312.

The method of utilizing sections 611 may be used alike in the above method. The foregoing various modified examples can be combined appropriately and respective effects can be exerted accordingly.

A component mounting operation in the component mounting apparatus 300 with the above detecting device 100 will be briefly depicted hereinbelow.

The circuit board 301 is held by the circuit board hold part 303 through the loader part 302 and positioned in the XY-direction. In the meantime, the transfer head part 210 is moved by the XY-robot 308 in X and Y-directions to suck electronic components 312 by respective suction nozzles 201 from the first component supply part 305A, the second component supply part 305B or the third component supply part 305C. After the components are sucked and prior to mounting the components to the circuit board 301, image-pickup of a suction posture of electronic component 312 sucked by each suction nozzle 201 is performed with utilization of the detecting device 100 installed in the transfer head part 210. The image-pickup of the suction posture is performed in this suction posture recognition operation similar to the above-described image-pickup operation for the component hold face 140 by the detecting device 100 while the camera stage 117 with the illuminating device 120, the light guide part 130 and the CCD camera 106 installed thereto is moved and positioned in the X-axis direction, preferably without being stopped. However, this suction posture recognition operation can be performed while the transfer head part 210 is moved towards the circuit board 301.

A positional deviation amount of each of all electronic components 312 sucked by the suction nozzles 201 is detected on basis of suction posture information of each of electronic components 312 which is sequentially taken, and shape information of the component library 402 included in the database part 401. The controller 150 calculates a rotational angle about the Z-axis to be corrected and movement amounts in X and Y-directions on basis of mounting position information of the board data 404 included in the database part 401, and the above positional deviation amount of the electronic component 312 in order to mount the electronic component 312 to a predetermined mounting position on the electronic circuit board 301. Each suction nozzle 201 is rotated about the Z-axis by the driving part 205 for rotation and is moved to a predetermined mounting position on the electronic circuit board 301 by the XY-robot 308 on basis of the calculated rotational angle about the Z-axis to be corrected and the movement amounts in the X and Y-directions. The electronic components 312 held by the suction nozzles 201 are sequentially mounted to mounting positions in this manner.

Since the component mounting apparatus 300 has the detecting device 100 at the transfer head part 210, an image-pickup process of suction postures of the electronic components 312 sucked by suction nozzles 201 can be sequentially performed during movement of the electronic components 312 to the circuit board 301 after being sucked. Therefore, a need of moving the transfer head part 210 to where a recognizer is disposed, as in the conventional art, is eliminated, so that mounting cycle time can be shortened and availability in a component mounting operation can be improved accordingly.

As above, while the controller 150 in the component mounting apparatus 300 controls a determination operation of good or not for suction nozzles 201 as its characteristic operation, the controller can also perform an operational control to be described below to the transfer head part 210 in relation to operation of the detecting device 100.

Specifically, since the electronic component mounting apparatus 300 has the detecting device 100 installed at the transfer head part 210, it becomes possible to perform image-pickup of a hold posture of each of electronic components 312 at a plurality of suction nozzles 201 included in the transfer head part 210, and sequentially mount to the circuit board 301 electronic component 312 for which this image-pickup operation is finished.

Meanwhile, the illuminating device 120 and the light guide part 130 constituting the detecting device 100 and disposed at the bottom plate 118 are arranged to be below electronic component 312 held by suction nozzle 201, and moreover, the circuit board 301 is disposed to be lower than the bottom plate 118 as illustrated in FIGS. 1 and 4. When a component mounting operation is performed by using suction nozzles 201 to mount electronic components to the circuit board 301, needless to say, the suction nozzle 201 moves toward the circuit board 301 while the bottom plate 118 is disposed to be deviated from the suction nozzle 201 which is to mount a component. Therefore, in an event of loss of synchronism between the bottom plate 118 and the suction nozzle 201 in their positional relationship, for example, by some trouble at the detecting device driving part 110 which constitutes the detecting device 100, at the driving parts 204 for ascent and descent in the transfer head part 210, or the like, the suction nozzle 201 which is to mount the component moves down in spite of presence of the bottom plate 118 below the suction nozzle 201, whereby there is a possibility that the suction nozzle 201 interferes with the illuminating device 120 and the light guide part 130 disposed at the bottom plate 118. As factors for the bottom plate 118 and the suction nozzle 201 to be out of synchronization in their positional relationship, there are conceivable that for example, (1) an output part of the detecting device driving motor 111 which constitutes the detecting device driving part 110 loosens, or stops during driving, (2) a trigger to the driving part 204 for ascending and descending the suction nozzle 201 malfunctions because of noise or the like, and the like.

For preventing the above interference, in a component mounting apparatus 350 as a modified example of the component mounting apparatus 300, such an arrangement can be adopted for the transfer head part 210 having the detecting device 100, which will be described more in detail below.

Figure 19:
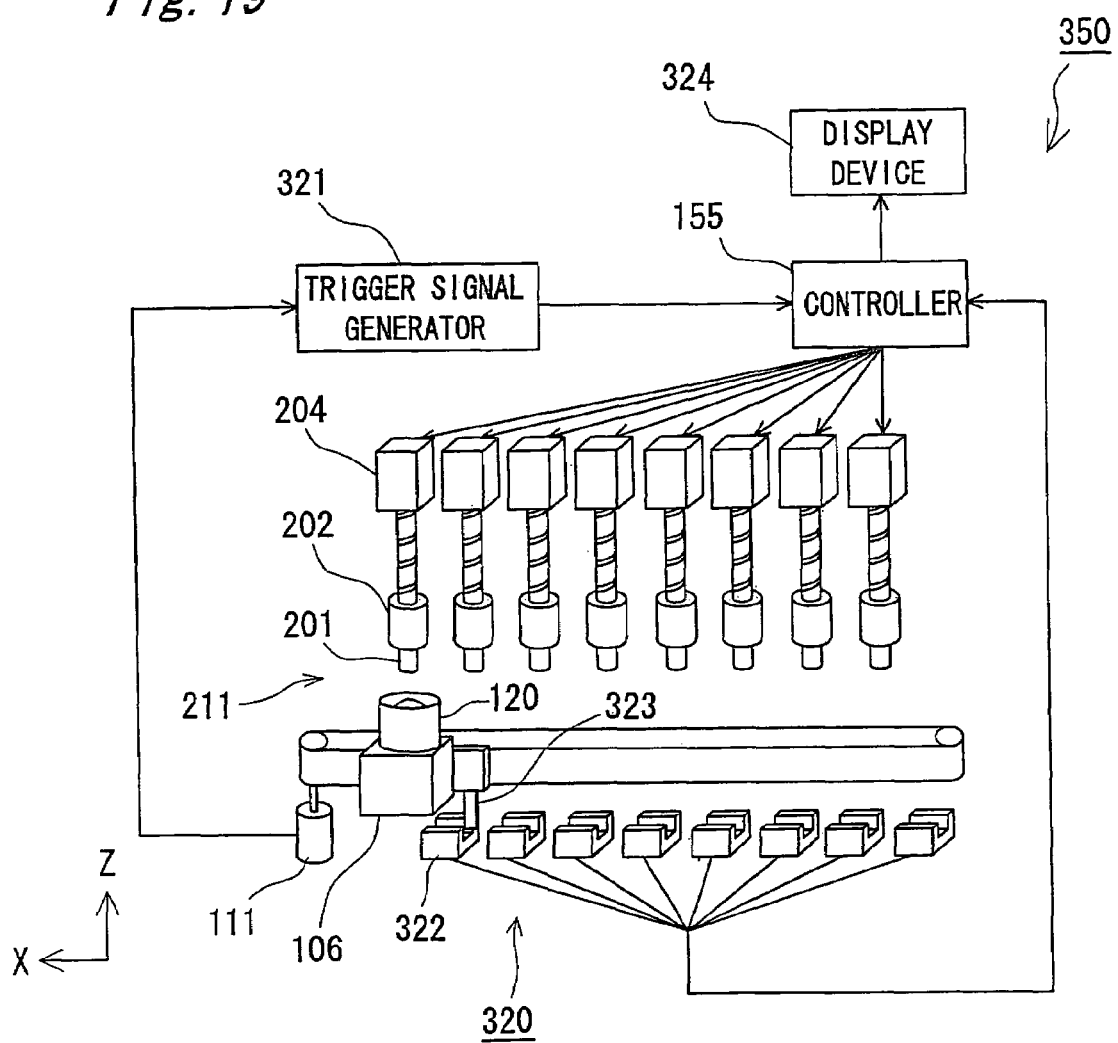
FIG. 19 is a diagram showing a configuration of a modified example of the electronic component mounting apparatus of FIG. 5 with an interference preventing device installed thereto.

FIG. 19 indicates a transfer head part 211, a controller 155 and an interference preventing device 320 provided in the component mounting apparatus 350. The transfer head part 211 and the controller 155 correspond to one modified example of the earlier described transfer head 210 and the controller 150, respectively. Constituent parts other than the transfer head part 211, the controller 155 and the interference preventing device 320 are the same as in the constitution of the above component mounting apparatus 300 and will be omitted from description here.

The transfer head part 211 has suction nozzles 201, nozzle setting heads 202, head member 203, driving parts 204 for ascent and descent, driving parts 205 for rotation, suction device 290, CCD camera 106, detecting device driving motor 111, bottom plate 118 and illuminating device 120 of the transfer head part 210. However, the bottom plate 118 has no light guide part 130 installed thereto, and the CCD camera 106 is installed just below the illuminating device 120. Linear sensor 115 and linear scale 116 are also not installed in the transfer head part.

The interference preventing device 320 has the controller 155, a trigger signal generator 321, photosensors 322, a dog 323 fixed, for example, to the bottom plate 118, and a display device 324. The photosensor 322 and the dog 323 constitute an example functioning as a position detector. The trigger signal generator 321 generates a trigger signal for ascent and descent, particularly for descent of suction nozzle 201 to control descent or ascent timing of the suction nozzle 201, and sends the signal to the controller 155. Accordingly, the CCD camera 106 is moved synchronously with downward movement of the suction nozzle 201. In a method for generating the trigger signal, the signal is generated at a time point when the CCD camera 106 reaches a predetermined position or at a time point after a predetermined time has passed since a movement start of the CCD camera 106.

The photosensor 322 is arranged by the same number as that of suction nozzles 201 along an X-axis direction corresponding to an arrangement position of each suction nozzle 201 to detect shielding of light by the dog 323. A detection signal is sent to the controller 155. Since the photosensor 322 corresponding to the suction nozzle 201 opposite to the illuminating device 120 and the CCD camera 106 is thus shielded by the dog 323, at which position of the suction nozzles 201 where the CCD camera 106 is located can be detected correctly.

Figure 20:
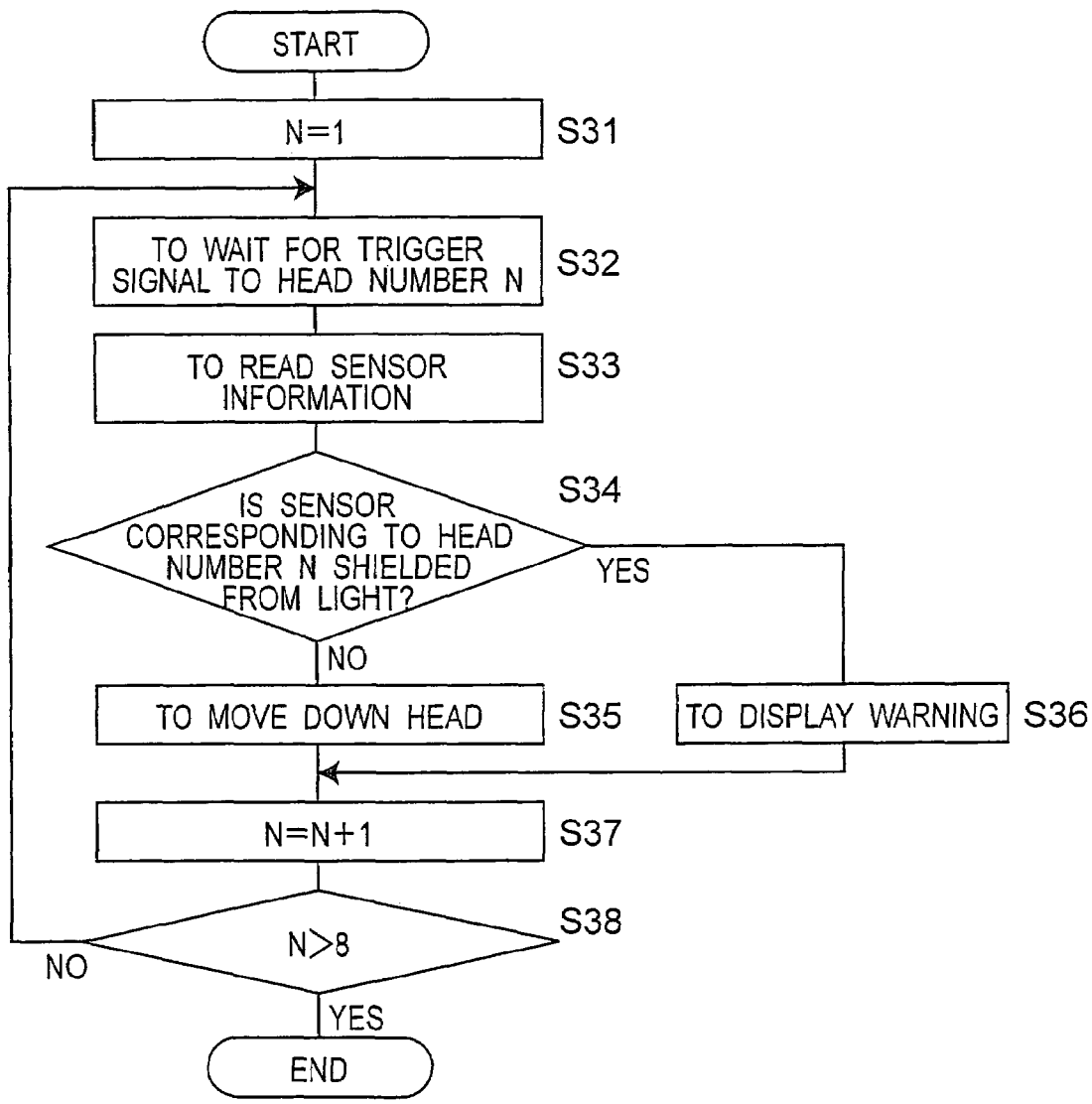
FIG. 20 is a flow chart explanatory of an operation at the interference preventing device shown in FIG. 19.

The controller 155 executes an algorithm for determining an instruction method to the driving parts 204 for ascent and descent on basis of signals from the trigger signal generator 321 and the photosensor 322. The controller 155 is constituted of a microcomputer. A functional part for executing the algorithm in the controller 155 is made an interference prevention judging part 153. FIG. 20 is a flow chart showing an example of the algorithm in a process where there are present eight suction nozzles 201 as shown in FIG. 19.

When a mounting operation starts, in step 31, a variable N expressing a number of the nozzle setting heads 202 (referred to as a "head number" hereinafter) is initialized to 1. In step 32, a trigger signal for starting a descent of suction nozzle 201 generally corresponding to the head number N is waited. At a mounting start time, the head number N is "1". After the trigger signal is inputted, a light shield state of each of the photosensors 322 is read in step 33 and it is checked in step 34 as to whether or not the photosensor 322 corresponding to the head number N detects light shielding by dog 323. When the corresponding photosensor 322 does not detect the dog 323, the process moves to step 35 and the suction nozzle 201 of the head number N is lowered. On the other hand, when light is shielded, the process shifts to step 36 because the CCD camera 106 would be interfered with if the suction nozzle 201 of the head number N were moved down.

The above-described steps 34-36 show an embodiment in which an operational instruction to the driving parts 204 for ascent and descent is stopped when a detection result of the interference preventing device 320 is abnormal. However, how to prevent interference is not limited to the above method, and a method, for example, of moving up and retreating the suction nozzle 201 to outside of an interference range with the CCD camera 106, moving down the suction nozzle 201 to a height whereat interference with the CCD camera 106 is avoided, or the like may be used in step 35.

When the photosensor 322 corresponding to the suction nozzle 201 to be moved down detects the dog 323, a warning notice is displayed to the display device 324 in step 36. When ascent and descent of the suction nozzle 201 is stopped by the driving part 204 for ascent and descent, a buzzer is sounded, an error is notified by communication, a lamp is turned on, or a like manner of warning notice may be used other than the above notification method. By this warning notification, for instance, an equipment operator can notice an abnormality of equipment at an early stage and can promptly inspect and recover the equipment.

In step 37 after step 35, 1 is added to the head number N. In step 38, it is confirmed whether or not the head number is over 8. The process returns to step 32 unless the head number exceeds 8, whereby steps are repeated to perform a process of confirming, before starting downward movement of each of eight suction nozzles 201, whether or not each suction nozzle 201 is allowed to move down. This detecting operation for interference prevention is terminated when the head number is over 8.

The above interference preventing device 320 can adopt a modification to be described hereinbelow.

Figure 21:
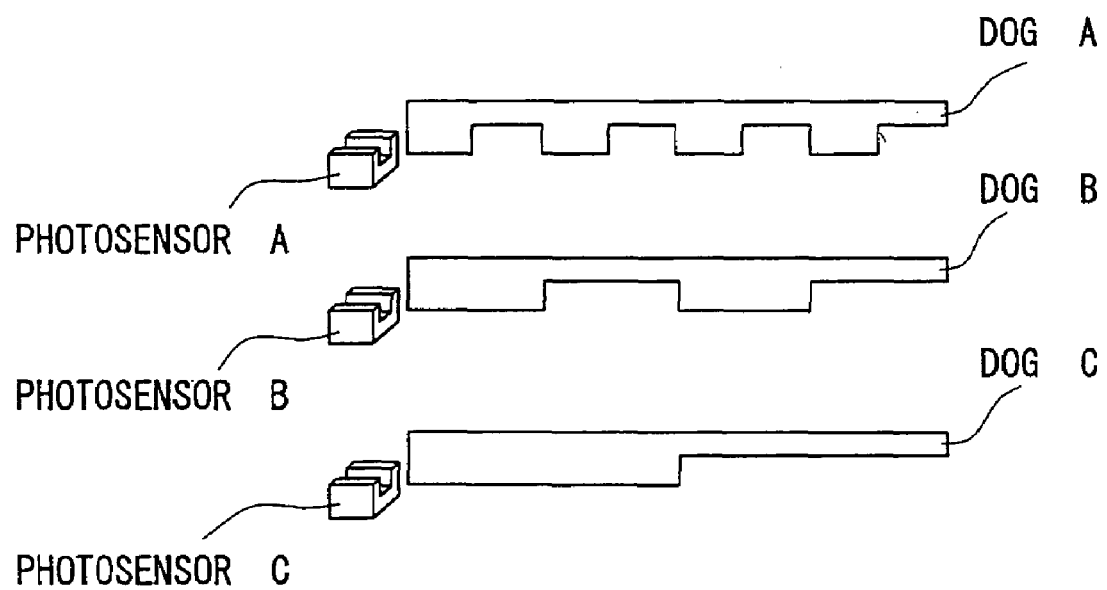
FIG. 21 is a diagram of a modified example of photosensors and dogs which constitute the interference preventing device of FIG. 19.

In FIG. 21, there are used three photosensors A-C and three dogs A-C for eight nozzle setting heads 202. Dogs A-C are fixed to, for example, the bottom plate 118, and the photosensors A-C are arranged to be equal in position as illustrated. The dogs A-C are shaped in a light shield pattern to express a least significant bit of a binary number, higher-order bit one more than the dog A and higher-order bit one more than the dog B, respectively. The photosensors A-C are arranged to correspond to the dogs A-C respectively, so that 3-bit detection information of eight patterns in total is generated by the dogs A-C and photosensors A-C.

This arrangement can obtain the same effect as that using the interference preventing device 320. Moreover, in comparison with the interference preventing device 320, a number of photosensors can be reduced although a number of dogs increases, whereby a more simplified structure is enabled. It is made possible to detect a present position of the CCD camera 106 directly from a corresponding sensor by arranging one or more sensors for detecting the present position of the CCD camera 106 as in the above interference preventing device 320 and its modified example.

Figure 22:
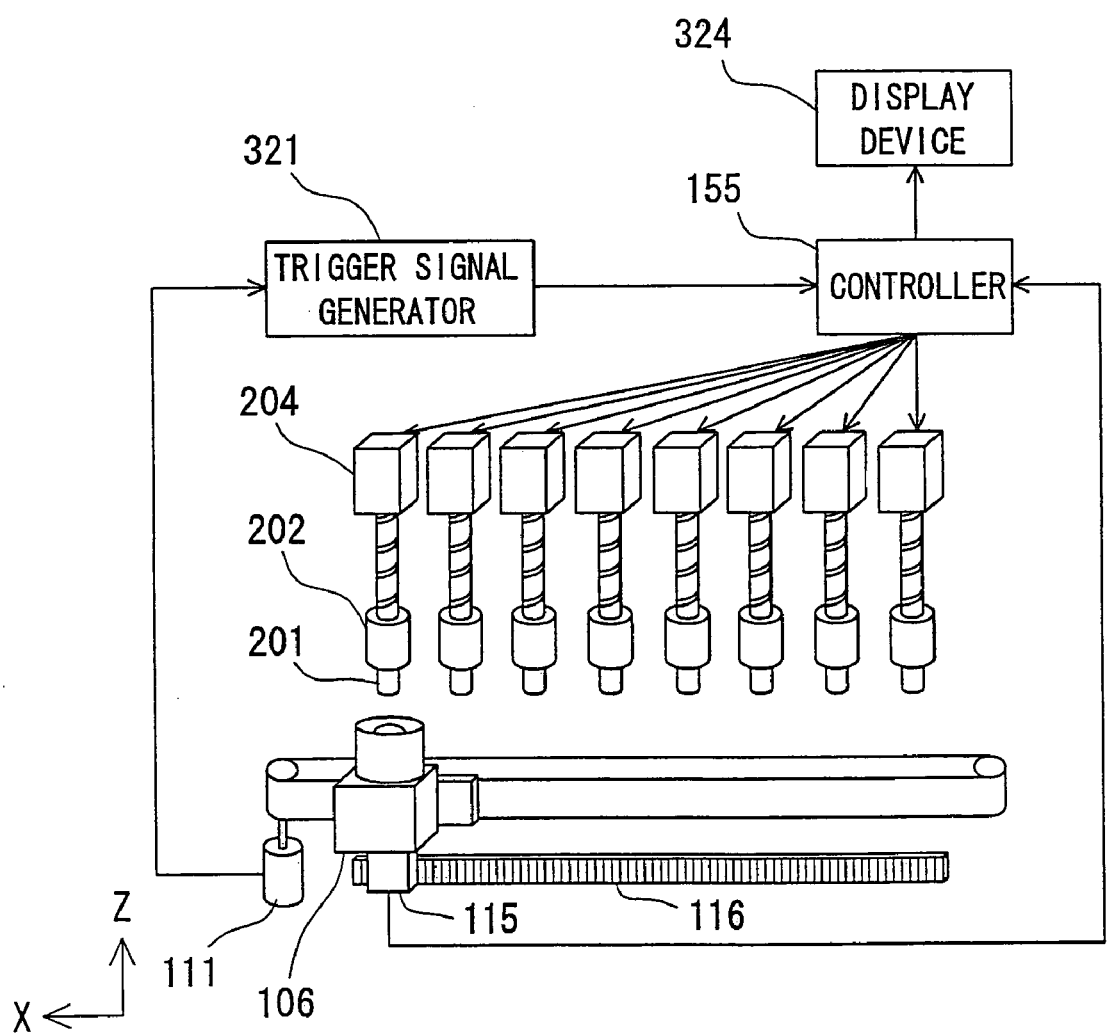
FIG. 22 is a diagram of a modified example of the interference preventing device of FIG. 19.

An arrangement shown in FIG. 22 may be adopted, in which linear sensor 115 and linear scale 116 are installed in place of photosensors 322 and dogs 323, as in the transfer head part 210. A correct position of CCD camera 106 can be detected by the linear sensor 115 and the linear scale 116.

Figure 23:
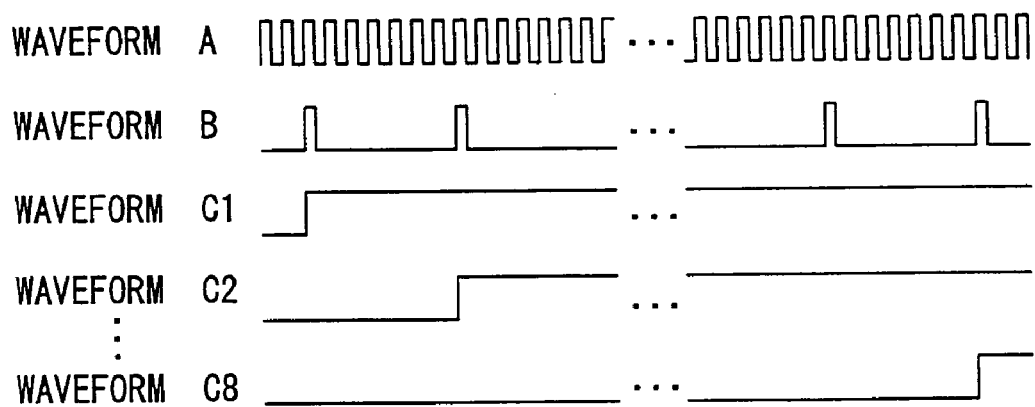
FIG. 23 is a diagram showing waveform examples of signals sent out from the interference preventing device of FIG. 22.

FIG. 23 represents an example of a method for generating a camera positional signal from waveforms of the linear sensor 115. Waveform A shows a rectangular wave generated from the linear sensor 115 by moving the CCD camera 106. Pulse signals at constant intervals are generated as indicated by waveform B from the rectangular wave, and eight camera positional signals in waveforms C1-C8 corresponding to eight nozzle setting heads 202 are generated by counting the pulse signals. The camera positional signals of this example are related to a case in which a camera movement direction is limited to one way along an X-axis direction, indicating that suction nozzles 201 are allowed to move down when waveform C1 and the like are on, that is, in a segment where these waveforms rise. After the CCD camera 106 passes a position corresponding to each nozzle setting head 202, a signal is kept ON at all times, thereby allowing the suction nozzles 201 to move down.

An algorithm for determining an instructional method to driving parts 204 for ascent and descent which is executed by controller 155 in a case of using the linear sensor 115 and the linear scale 116 will be described hereinafter.

Figure 24:
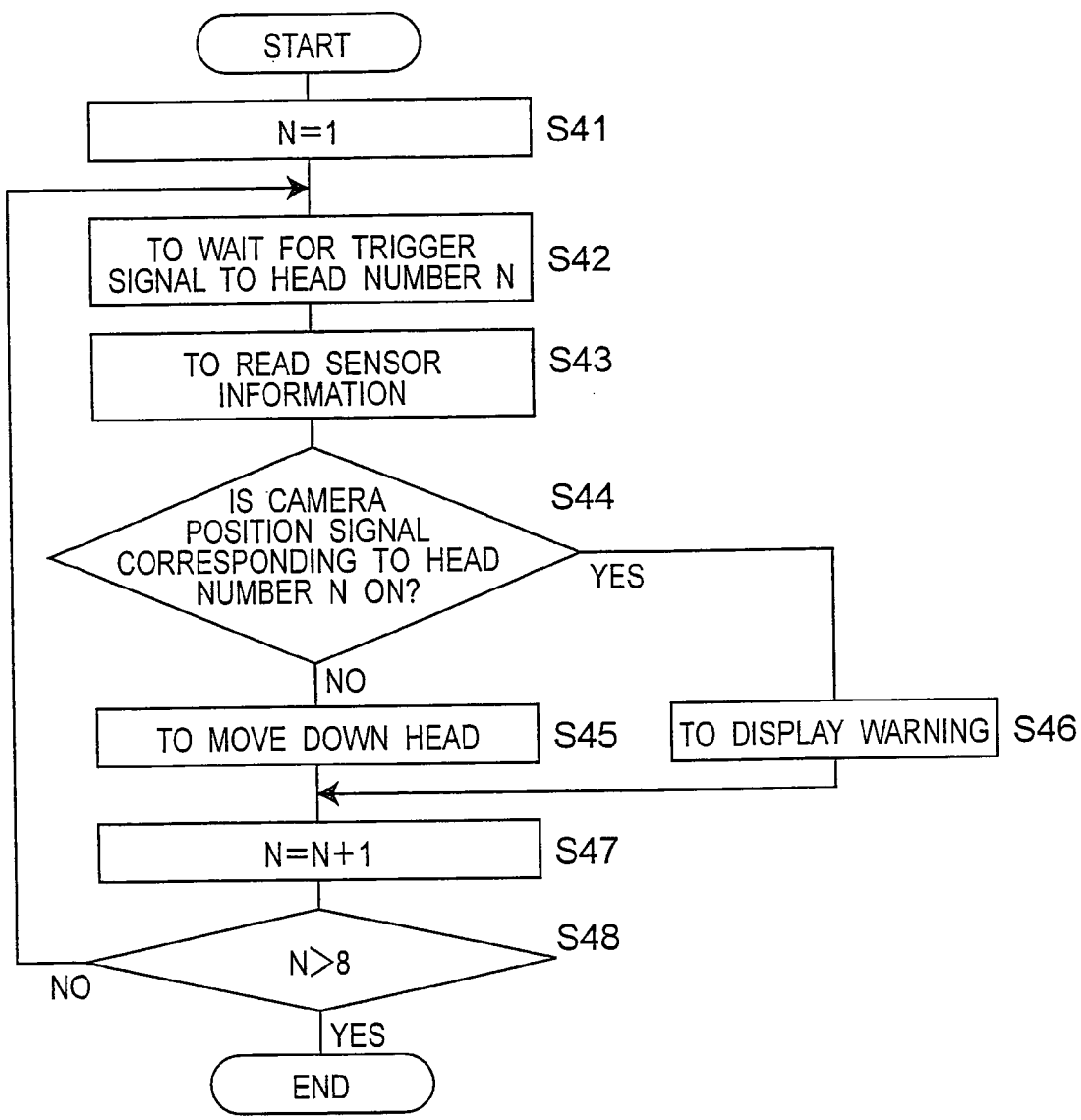
FIG. 24 is a flow chart explanatory of operation in the interference preventing device of FIG. 22.
Figure 25:
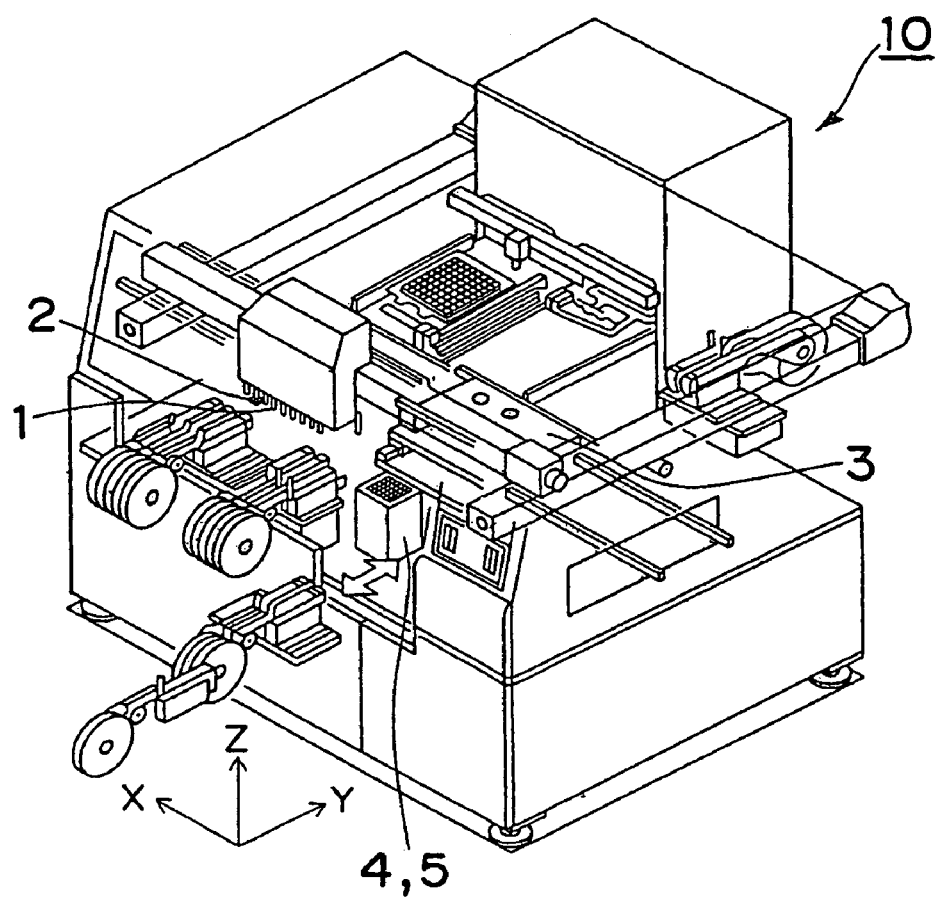
FIG. 25 is a perspective view showing a configuration of a conventional electronic component mounting apparatus.

FIG. 24 shows a flow chart of an example of an algorithm of a process in which there are eight nozzle setting heads 202 similar to the foregoing example. Steps 41-43 and 45-48 shown in FIG. 24 are the same as steps 31-33 and 35-38 in FIG. 20, and only step 44 is different. Step 44 alone will be described here. In step 44, it is confirmed before each suction nozzle 201 is moved down whether or not a camera positional signal corresponding to suction nozzle 201 to be moved down is ON. It is decided that the suction nozzle 201 can be moved down only when the camera positional signal is ON.

In a constitution using the linear sensor 115 and the linear scale 116 as in FIG. 22, since a correct position of the CCD camera 106 can be detected, a signal can be used as a signal for controlling a shutter timing for the CCD camera 106 to perform image-pickup of electronic component 312 sucked by each suction nozzle 201. The waveform B shown in FIG. 23 is used as a shutter signal in this case. This constitution enables image-pickup of the suction nozzle 201 when the suction nozzle 201 to be imaged and the CCD camera 106 are in a correct positional relationship, for example, when virtual axis 160 of the suction nozzle 201 is brought to a center of the CCD camera 106.

Suppose that a position of the nozzle setting heads 202 is changed in the X-axis direction, it is necessary to change a position of sensors in a constitution using the photosensors and the like as in FIGS. 19 and 21. However, this need is eliminated in a case where the linear sensor 115 and the linear scale 116 are used, and a present position of the CCD camera 106 can be detected directly.

For the above component mounting apparatus 350, the constitution of the transfer head part 210 in FIG. 4 in the component mounting apparatus 300 can be employed in place of the transfer head part 211.

In the component mounting apparatus 350 alike, after a component mounting operation is performed a set number of times before a next component mounting operation is performed, a determination operation of good or not of the suction nozzles 201 which is discussed in relation to the component mounting apparatus 300 is performed. However, it is possible in the component mounting apparatus 350 to perform only the above-described interference prevention operation between the suction nozzles 201 and the CCD camera 106 without executing a determination operation of good or not of the suction nozzles 201.

Although the transfer head part 210 is installed at the XY-robot 308 in each of the above embodiments, any form can be adopted so long as the circuit board 301 and the transfer head part 210 are configured to move relatively to each other, for example, the transfer head part 210 is moved in the Y-axis direction and the circuit board 301 is moved in the X-axis direction.

In the above explanation, the component mounting apparatus 350 is explained as a modified example of the component mounting apparatus 300. However, the component mounting apparatus 350 can work without performing an operation of the detecting device 100.

Although the present invention has been fully described in connection with preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A method for determining whether or not a component holder is defective, comprising:
    illuminating a component hold face of a component holder by emitting light to said component holder, said component hold face having an area greater than an area of a light reflection face of a component held by said component holder, wherein said component hold face corresponds to a surface of said component holder that faces a surface of said component held by said component holder, and wherein said light reflection face corresponds to a surface of said component other than said surface of said component that faces said component hold face;
    performing image-pickup of said component hold face, when illuminated by emitting the light to said component holder, so as to provide image-pickup information of said component hold face when illuminated by emitting the light to said component holder; and
    determining that said component holder is defective when luminance of a non-cover region of said component hold face, based on said image-pickup information, is not smaller than a setting value, wherein said non-cover region corresponds to a region of said component hold face other than a region of said component hold face covered by said component,
    wherein said non-cover region of said component hold face is divided into sections, each of which has said setting value, such that, determining that said component holder is defective comprises determining that said component holder is defective when luminance of at least one of said sections of said non-cover region, based on said image-pickup information, is not smaller than said setting value.

2. The method according to claim 1, wherein
    emitting light to said component holder comprises emitting light to said component holder in an amount which exceeds an amount of light necessary for performing the image-pickup of said component hold face.

3. A component mounting method comprising:
    performing a component mounting operation that includes using a component holder to hold a component and mount said component onto a circuit board; and
    after performing said component mounting operation a set number of times, determining whether or not said component holder is defective by
        (i) illuminating a component hold face of a component holder by emitting light to said component holder, said component hold face having an area greater than an area of a light reflection face of a component held by said component holder, wherein said component hold face corresponds to a surface of said component holder that faces a surface of said component held by said component holder, and wherein said light reflection face corresponds to a surface of said component other than said surface of said component that faces said component hold face, (ii) performing image-pickup of said component hold face, when illuminated by emitting the light to said component holder, so as to provide image-pickup information of said component hold face when illuminated by emitting the light to said component holder, and (iii) determining that said component holder is defective when luminance of a non-cover region of said component hold face, based on said image-pickup information, is not smaller than a setting value, wherein said non-cover region corresponds to a region of said component hold face other than a region of said component hold face covered by said another component, wherein said non-cover region of said component hold face is divided into sections, each of which has said setting value, such that, determining that said component holder is defective comprises determining that said component holder is defective when luminance of at least one of said sections of said non-cover region, based on said image-pickup information, is not smaller than said setting value.

4. The component mounting method according to claim 3, further comprising:

performing a luminance reduction process on said component hold face of said component holder when said component holder is determined to be defective.

5. The component mounting method according to claim 4, wherein performing said component mounting operation comprises using linearly arranged component holders to hold components and mount said components onto said circuit board by independently moving up and down said component holders, and further comprising:

prior to using said component holders to mount said components onto said circuit board, performing image-pickup of said components, held by said component holders, by using an image-pickup device that is moved below said component holders along an arrangement direction of said component holders;

detecting a position of said image-pickup device while said image-pickup device is moved below said component holders in said arrangement direction; and controlling downward movement of said component holders based on the position of said image-pickup device as detected.

6. The component mounting method according to claim 4, wherein emitting light to said component holder comprises emitting light to said component holder in an amount which exceeds an amount of light necessary for performing the image-pickup of said component hold face.

7. The component mounting method according to claim 6, wherein performing said component mounting operation comprises using linearly arranged component holders to hold components and mount said components onto said circuit board by independently moving up and down said component holders, and further comprising:

prior to using said component holders to mount said components onto said circuit board, performing image-pickup of said components, held by said component holders, by using an image-pickup device that is moved below said component holders along an arrangement direction of said component holders;

detecting a position of said image-pickup device while said image-pickup device is moved below said component holders in said arrangement direction; and controlling downward movement of said component holders based on the position of said image-pickup device as detected.

8. The component mounting method according to claim 5, wherein performing said component mounting operation comprises using linearly arranged component holders to hold components and mount said components onto said circuit board by independently moving up and down said component holders, and further comprising:

prior to using said component holders to mount said components onto said circuit board, performing image-pickup of said components, held by said component holders, by using an image-pickup device that is moved below said component holders along an arrangement direction of said component holders;

detecting a position of said image-pickup device while said image-pickup device is moved below said component holders in said arrangement direction; and controlling downward movement of said component holders based on the position of said image-pickup device as detected.

9. The component mounting method according to claim 5, wherein emitting light to said component holder comprises emitting light to said component holder in an amount which exceeds an amount of light necessary for performing the image-pickup of said component hold face.

10. The component mounting method according to claim 9, wherein performing said component mounting operation comprises using linearly arranged component holders to hold components and mount said components onto said circuit board by independently moving up and down said component holders, and further comprising:

prior to using said component holders to mount said components onto said circuit board, performing image-pickup of said components, held by said component holders, by using an image-pickup device that is moved below said component holders along an arrangement direction of said component holders;

detecting a position of said image-pickup device while said image-pickup device is moved below said component holders in said arrangement direction; and controlling downward movement of said component holders based on the position of said image-pickup device as detected.

* * * * *